US010796888B2

(12) United States Patent
Sun et al.

(10) Patent No.: US 10,796,888 B2

(45) Date of Patent: Oct. 6, 2020

(54) ION ASSISTED DEPOSITION FOR RARE-EARTH OXIDE BASED THIN FILM COATINGS ON PROCESS RINGS

(71) Applicant: Applied Materials, Inc., Santa Clara, CA (US)

(72) Inventors: Jennifer Y. Sun, Mountain View, CA (US); Biraja P. Kanungo, San Jose, CA (US); Vahid Firouzdor, San Mateo, CA (US); Ying Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 401 days.

(21) Appl. No.: 15/640,287

(22) Filed: Jun. 30, 2017

(65) Prior Publication Data

US 2017/0301522 A1 Oct. 19, 2017

Related U.S. Application Data

(62) Division of application No. 14/032,098, filed on Sep. 19, 2013, now Pat. No. 9,711,334.

(Continued)

(51) Int. Cl.

| | |
|---|---|
| ***H01J 37/32*** | (2006.01) |
| ***C23C 14/00*** | (2006.01) |
| ***C23C 14/08*** | (2006.01) |

(52) U.S. Cl.

CPC .... *H01J 37/32642* (2013.01); *C23C 14/0015* (2013.01); *C23C 14/0031* (2013.01); *C23C 14/08* (2013.01); *H01J 37/32477* (2013.01); *H01J 37/32495* (2013.01); *Y10T 428/1317* (2015.01)

(58) Field of Classification Search

None

See application file for complete search history.

(56) References Cited

U.S. PATENT DOCUMENTS 3,796,182 A 3/1974 Rosler
4,399,199 A 8/1983 McGill et al.

(Continued)

FOREIGN PATENT DOCUMENTS

JP 2000001362 1/2000
JP 2006118053 5/2006

(Continued)

OTHER PUBLICATIONS

Bib Data and Translation; WO-2014119177-A1; Kajiwara Yuki; Aug. 2014 (Year: 2014).*

(Continued)

*Primary Examiner* — Humera N. Sheikh
*Assistant Examiner* — Elizabeth D Ivey
(74) *Attorney, Agent, or Firm* — Lowenstein Sandler LLP

(57) ABSTRACT

A ring shaped body includes a top flat region, a ring inner side and a ring outer side. The ring inner side comprises an approximately vertical wall. A conformal protective layer is disposed on at least the top flat region, the ring inner side and the ring outer side of the ring shaped body. The protective layer has a first thickness of less than 300 μm on the top flat region and a second thickness on the vertical wall of the ring inner side, where the second thickness is 45-70% of the first thickness.

11 Claims, 9 Drawing Sheets

550
525
515
510
Ring Inner Side 552
Ring Outer Side 554
520
510
505

Related U.S. Application Data

(60) Provisional application No. 61/856,597, filed on Jul. 19, 2013.

(56) References Cited

U.S. PATENT DOCUMENTS 4,695,439 A 9/1987 Ritsko et al.
4,773,928 A 9/1988 Houck et al.
4,880,614 A 11/1989 Strangman et al.
4,988,670 A 1/1991 Itozaki et al.
5,415,756 A 5/1995 Wolfe et al.
5,573,862 A 11/1996 Gualtieri et al.
5,741,544 A 4/1998 Mahulikar
5,837,058 A 11/1998 Chen et al.
6,326,076 B1 12/2001 Takai
6,383,964 B1 5/2002 Nakahara et al.
6,530,990 B2 3/2003 Kong et al.
6,548,424 B2 4/2003 Putkonen
6,645,585 B2 11/2003 Ozono
6,777,353 B2 8/2004 Putkonen
6,783,875 B2 8/2004 Yamada et al.
6,858,332 B2 2/2005 Yamada
6,858,546 B2 2/2005 Niinisto et al.
6,884,514 B2 4/2005 Simpson et al.
6,949,203 B2 9/2005 Hsieh et al.
6,962,524 B2 11/2005 Butterfield et al.
7,101,819 B2 9/2006 Rosenflanz et al.
7,226,673 B2 6/2007 Yamada et al.
7,278,911 B2 10/2007 Butterfield et al.
7,351,482 B2 4/2008 Boutwell et al.
7,351,658 B2 4/2008 Putkonen
7,354,663 B2 4/2008 Torigoe et al.
7,422,516 B2 9/2008 Butterfield et al.
7,479,464 B2 1/2009 Sun et al.
7,498,272 B2 3/2009 Niinisto et al.
7,507,268 B2 3/2009 Rosenflanz
7,510,585 B2 3/2009 Rosenflanz
7,672,110 B2 3/2010 Sun et al.
7,696,117 B2 4/2010 Sun et al.
7,838,083 B1 11/2010 Youchison et al.
8,034,734 B2 10/2011 Sun et al.
8,110,043 B2 2/2012 Hass et al.
8,129,029 B2 3/2012 Sun et al.
8,206,829 B2 6/2012 Sun et al.
8,367,227 B2 2/2013 Sun et al.
8,758,858 B2 6/2014 Sun et al.
8,829,079 B2 9/2014 Shultz et al.
8,941,969 B2 1/2015 Thach et al.
9,034,199 B2 5/2015 Duan et al.
9,090,046 B2 7/2015 Sun et al.
9,212,099 B2 12/2015 Sun et al.
9,583,369 B2 2/2017 Sun et al.
2002/0018921 A1 2/2002 Yamada et al.
2002/0043666 A1 4/2002 Parsons et al.
2002/0100424 A1 8/2002 Sun et al.
2003/0024807 A1 2/2003 Baldwin et al.
2003/0029563 A1 2/2003 Kaushal et al.
2003/0047464 A1 3/2003 Sun et al.
2003/0110708 A1 6/2003 Rosenflanz
2003/0134134 A1 7/2003 Simpson et al.
2003/0164354 A1 9/2003 Hsieh et al.
2003/0175142 A1 9/2003 Milonopoulou et al.
2003/0200929 A1* 10/2003 Otsuki ................ C23C 16/4404 118/723 R
2004/0023811 A1 2/2004 Iijima
2004/0157473 A1 8/2004 Hayashi et al.
2004/0191545 A1 9/2004 Han et al.
2005/0016684 A1 1/2005 Sun et al.
2005/0037193 A1 2/2005 Sun et al.
2005/0164513 A1 7/2005 DeOrnellas et al.
2005/0181566 A1 8/2005 Machida et al.
2005/0284770 A1 12/2005 Butterfield et al.
2006/0051602 A1 3/2006 Iacovangelo et al.
2006/0081939 A1 4/2006 Akasaka et al.
2006/0090704 A1 5/2006 Ide et al.
2006/0096704 A1 5/2006 Kim
2006/0110609 A1 5/2006 Eaton et al.
2006/0141139 A1 6/2006 Iorio et al.
2006/0172544 A1* 8/2006 Inaki ......................... C23C 4/18 438/710
2007/0047170 A1 3/2007 Sun et al.
2007/0111030 A1 5/2007 Nakano et al.
2008/0009417 A1 1/2008 Lou et al.
2008/0029032 A1 2/2008 Sun et al.
2008/0057326 A1 3/2008 Schlichting et al.
2008/0108225 A1 5/2008 Sun et al.
2008/0115725 A1 5/2008 Ibe et al.
2008/0142755 A1 6/2008 Vaidhyanathan et al.
2008/0213496 A1 9/2008 Sun et al.
2008/0236744 A1* 10/2008 Furuse ............. H01J 37/32477 156/345.1
2008/0237029 A1 10/2008 Tang et al.
2008/0261800 A1 10/2008 Yuan et al.
2008/0264564 A1 10/2008 Sun et al.
2008/0264565 A1* 10/2008 Sun ...................... C04B 35/111 156/345.1
2008/0268171 A1 10/2008 Ma et al.
2009/0036292 A1 2/2009 Sun et al.
2009/0142588 A1 6/2009 Ohmi et al.
2009/0162647 A1 6/2009 Sun et al.
2009/0214825 A1* 8/2009 Sun .......................... C23C 4/11 428/141
2010/0028572 A1 2/2010 Kobayashi et al.
2010/0119843 A1* 5/2010 Sun .................. H01J 37/32477 428/426
2010/0129670 A1 5/2010 Sun et al.
2010/0160143 A1 6/2010 Sun et al.
2011/0086178 A1 4/2011 Ruud et al.
2011/0129684 A1 6/2011 Okamoto et al.
2011/0135915 A1 6/2011 Lee et al.
2011/0198034 A1 8/2011 Sun et al.
2011/0315081 A1 12/2011 Law et al.
2012/0034469 A1 2/2012 Sun et al.
2012/0035046 A1 2/2012 Rosenflanz
2012/0074514 A1 3/2012 Nguyen et al.
2012/0104703 A1 5/2012 Sun et al.
2012/0125488 A1 5/2012 Sun et al.
2012/0144640 A1 6/2012 Shih et al.
2012/0154916 A1 6/2012 Nishimoto et al.
2012/0183790 A1 7/2012 Petorak et al.
2012/0196139 A1 8/2012 Petorak et al.
2012/0237745 A1 9/2012 Dierkes et al.
2012/0247667 A1* 10/2012 Hashiguchi ....... H01J 37/32477 156/345.3
2013/0026693 A1 1/2013 Ranish et al.
2013/0048606 A1 2/2013 Mao et al.
2013/0071685 A1 3/2013 Iwaki et al.
2013/0115097 A1* 5/2013 Berger .................... B32B 15/01 416/241 R
2013/0130052 A1 5/2013 Menuey et al.
2013/0156958 A1 6/2013 Belov et al.
2013/0168020 A1* 7/2013 Hashiguchi ....... H01J 37/32642 156/345.51
2013/0174983 A1 7/2013 Kikuchi et al.
2013/0216783 A1 8/2013 Duan et al.
2013/0216821 A1 8/2013 Sun et al.
2013/0224457 A1 8/2013 Lee
2013/0224498 A1 8/2013 Sun et al.
2013/0273313 A1 10/2013 Sun et al.
2013/0273327 A1 10/2013 Sun et al.
2013/0284373 A1 10/2013 Sun et al.
2013/0288037 A1 10/2013 Sun et al.
2013/0333592 A1 12/2013 Nakagawa et al.
2014/0030486 A1 1/2014 Sun et al.
2014/0030533 A1 1/2014 Sun et al.
2014/0031533 A1 1/2014 Liu et al.
2014/0034242 A1* 2/2014 Sant .................. H01J 37/32605 156/345.51
2014/0037969 A1 2/2014 Margolies et al.
2014/0154465 A1 6/2014 Sun et al.
2014/0177123 A1 6/2014 Thach et al.
2014/0234653 A1* 8/2014 Mizuno ..................... C23C 4/10 428/649

(56) References Cited

U.S. PATENT DOCUMENTS

| | | | |
|---|---|---|---|
| 2014/0349073 | A1 | 11/2014 | Sun et al. |
| 2014/0363596 | A1 | 12/2014 | Sun et al. |
| 2014/0377504 | A1 | 12/2014 | Sun et al. |
| 2015/0024155 | A1 | 1/2015 | Sun et al. |
| 2015/0218057 | A1 | 8/2015 | Duan et al. |
| 2015/0270108 | A1 | 9/2015 | Sun et al. |
| 2015/0275361 | A1 | 10/2015 | Lubomirsky et al. |
| 2015/0275375 | A1 | 10/2015 | Kim et al. |
| 2015/0299050 | A1 | 10/2015 | Sun et al. |
| 2016/0042924 | A1 | 2/2016 | Kim et al. |

FOREIGN PATENT DOCUMENTS

| | | | | |
|---|---|---|---|---|
| JP | 2007-138288 A | 6/2007 | | |
| JP | 2007-191794 A | 8/2007 | | |
| JP | 2009068066 | 4/2009 | | |
| JP | 2010006641 | 1/2010 | | |
| KR | 10-2003-0025007 | 3/2003 | | |
| KR | 10-2007-0013118 | 1/2007 | | |
| KR | 10-1108692 B1 | 1/2012 | | |
| TW | 201036086 | 10/2010 | | |
| WO | WO2002000968 A1 | 1/2002 | | |
| WO | WO2012012431 | 1/2012 | | |
| WO | WO2012033326 A2 | 3/2012 | | |
| WO | WO-2013047589 A1 * | 4/2013 | ............... | C23C 4/10 |
| WO | WO-2014119177 A1 * | 8/2014 | .......... | H01J 37/3244 |
| WO | WO2015153123 A1 | 10/2015 | | |

OTHER PUBLICATIONS

Hass et al., "Gas jet assisted vapor deposition of yttria stabilized zirconia," Department of Materials Science and Engineering, School of Engineering and Applied Science, published Feb. 27, 2009 University of Virginia, Charlottesville, Virginia.

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

Refke, et al "LPPS thin film technology for the application of TBC systems", International Thermal Spray Conference, Basel Switzerland, May 2-4, 2005, 6 pages.

Lewis, Richard J.Sr., editor; Hawley's Condensed Chemical Dictionary, 12th edition, 1993, pp. 540 & 990, Van Nostrand Reinhold company, New York.

Machine translation of KR10-1108692 B1 by Park et al., issued Jan. 25, 2012.

Greenwood, N.N. et al., "Chemistry of the Elements" (2nd Edition), 1998, p. 1295: Appendix 5: Effective Ionic Radii in pm for Various Oxidation States; School of Chemistry, University of Leeds, U.K.; online version available at app.knovel.com/hotlink/pdf/id:kt003BKDL1/chemistry-elements-2nd/effective-ionic-radii.

Wachtman, J.B. et al., ed. "Ceramic Films and Coatings", Ch. 6, "Optical Thin Films", copyright 1993, Noyes Publications, pp. 189-223. Online version available at: app.knovel.com/hotlink/pdf/Id:kt00194M71/ceramic-films-coatings/optical-thin-films.

International Search Report and Written Opinion of the International Searching Authority dated Nov. 5, 2014 in International Application No. PCT/US2014/046734.

* cited by examiner

ION ASSISTED DEPOSITION FOR RARE-EARTH OXIDE BASED THIN FILM COATINGS ON PROCESS RINGS

RELATED APPLICATIONS

This patent application is a divisional application of U.S. patent application Ser. No. 14/032,098, filed Sep. 19, 2013, which claims the benefit under 35 U.S.C. § 119(e) of U.S. Provisional Application No. 61/856,597, filed Jul. 19, 2013. Patent application Ser. No. 14/032,098 is incorporated by reference herein.

TECHNICAL FIELD

Embodiments of the present invention relate, in general, to chamber process rings having a thin film plasma resistant protective layer.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma.

Currently process kit rings have performance issues because of high erosion rate and plasma chemistry interaction. Typically an insert ring and single ring are made out of quartz for conductor etch and Si for dielectric etch. These rings sit around the wafer to make the plasma density uniform for uniform etching. However, quartz and Si have very high erosion rates under various etch chemistries and bias powers. Severe erosion of the rings can result in on wafer based particle defects, process shift, deposition of erosion bi-product on other chamber components and reduction in chamber yield.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide an article such as a ring that has an erosion resistant thin film protective layer to enhance a lifetime of the ring and reduce on-wafer defects without affecting plasma uniformity. The protective layer may have a thickness up to approximately 300 μm, and may provide plasma corrosion resistance for protection of the ring. The protective layer may be formed on the ring using ion assisted deposition (IAD) (e.g., using electron beam IAD (EB-IAD)). The thin film protective layer may be $Y_3Al_5O_{12}$ (YAG), $Y_4Al_2O_9$ (YAM), $Er_2O_3$, $Gd_2O_3$, $Er_3Al_5O_{12}$ (EAG), $Gd_3Al_5O_{12}$ (GAG), a ceramic compound comprising $Y_4Al_2O_9$ and a solid-solution of $Y_2O_3$—$ZrO_2$, or another rare-earth oxide. The improved erosion resistance provided by the thin film protective layer may improve the service life of the ring, while reducing maintenance and manufacturing cost. Additionally, the IAD coating can be applied thick enough to provide a longer life time for the ring. IAD coatings can be applied and later refurbished at low cost.

Figure 1:
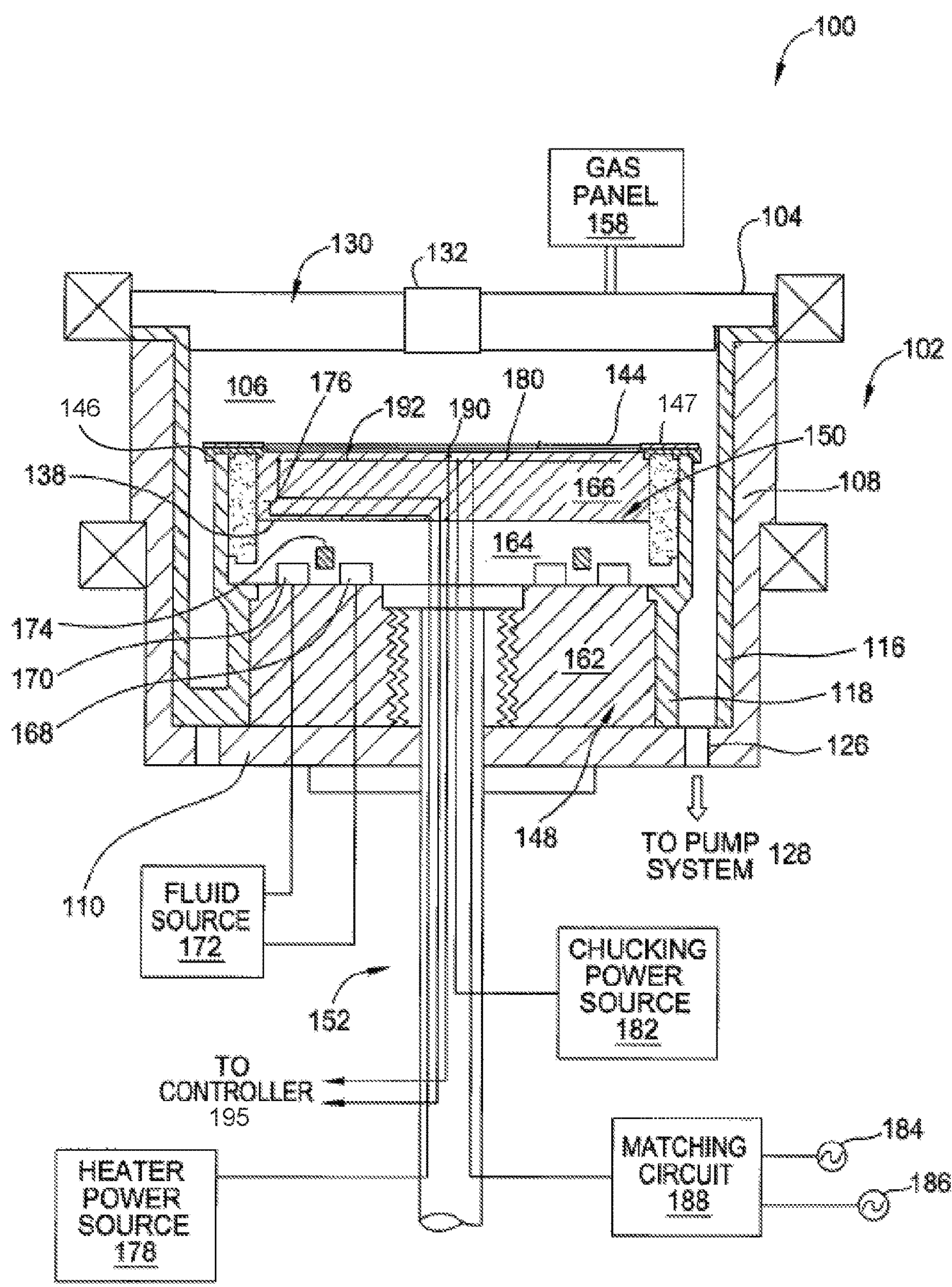
FIG. 1 depicts a sectional view of one embodiment of a processing chamber.

FIG. 1 is a sectional view of a semiconductor processing chamber 100 having one or more chamber components that are coated with a thin film protective layer in accordance with embodiments of the present invention. The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may include a thin film protective layer include a substrate support assembly 148, an electrostatic chuck (ESC) 150, a ring (e.g., a process kit ring or single ring), a chamber wall, a base, a gas distribution plate, a showerhead, a liner, a liner kit, a shield, a plasma screen, a flow equalizer, a cooling base, a chamber viewport, a chamber lid 104, a nozzle, and so on. In one particular embodiment, a protective layer 147 is applied over a ring 146.

The thin film protective layer 147, which is described in greater detail below, is a rare earth oxide layer deposited by ion assisted deposition (IAD). The thin film protective layer 147 may include $Y_2O_3$ and $Y_2O_3$ based ceramics, $Y_3Al_5O_{12}$ (YAG), $Y_4Al_2O_9$ (YAM), $Er_2O_3$ and $Er_2O_3$ based ceramics, $Gd_2O_3$ and $Gd_2O_3$ based ceramics, $Er_3Al_5O_{12}$ (EAG), $Gd_3Al_5O_{12}$ (GAG), $Nd_2O_3$ and $Nd_2O_3$ based ceramics, $YAlO_3$ (YAP), $Er_4Al_2O_9$ (EAM), $ErAlO_3$ (EAP), $Gd_4Al_2O_9$ (GdAM), $GdAlO_3$ (GdAP), $Nd_3Al_5O_{12}$ (NdAG), $Nd_4Al_2O_9$ (NdAM), $NdAlO_3$ (NdAP), and/or a ceramic compound comprising $Y_4Al_2O_9$ and a solid-solution of $Y_2O_3$—$ZrO_2$. The thin film protective layer may also include $YF_3$, Er—Y compositions (e.g., Er 80 wt % and Y 20 wt %), Er—Al—Y compositions (e.g., Er 70 wt %, Al 10 wt %, and Y 20 wt %), Er—Y—Zr compositions (e.g., Er 70 wt %, Y 20 wt % and Zr-10 wt %), or Er—Al compositions (e.g., Er 80 wr % and Al 20 wt %).

The thin film protective layer 147 may also be based on a solid solution formed by any of the aforementioned ceramics. With reference to the ceramic compound comprising $Y_4Al_2O_9$ and a solid-solution of $Y_2O_3$—$ZrO_2$, in one embodiment, the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0-60 mol % and $Al_2O_3$ in a range of 0-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0-20 mol % and $Al_2O_3$ in a range of 10-20 mol %. In another embodiment, the ceramic compound can include $Y_2O_3$ in a range of 60-80 mol %, $ZrO_2$ in a range of 0-10 mol % and $Al_2O_3$ in a range of 20-40 mol %. In another embodiment, the ceramic compound can include $Y_2O_3$ in a range of 40-60 mol %, $ZrO_2$ in a range of 0-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the protective layer. In one embodiment, the alternative ceramic compound can include $Y_2O_3$ in a range of 40-45 mol %, $ZrO_2$ in a range of 0-10 mol %, Er2O3 in a range of 35-40 mol %, $Gd_2O_3$ in a range of 5-10 mol % and $SiO_2$ in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$. In one embodiment, the thin film protective layer 147 includes 70-75 mol % $Y_2O_3$ and 25-30 mol % $ZrO_2$. In a further embodiment, the thin film protective layer 147 is a material entitled YZ20 that includes 73.13 mol % $Y_2O_3$ and 26.87 mol % $ZrO_2$.

Any of the aforementioned thin film protective layers may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

The thin film protective layer 147 may be an IAD coating applied over different ceramics including oxide based ceramics, Nitride based ceramics and Carbide based ceramics. Examples of oxide based ceramics include $SiO_2$ (quartz), $Al_2O_3$, $Y_2O_3$, and other metal oxides having the chemical formula $M_xO_y$. Examples of Carbide based ceramics include SiC, Si—SiC, and so on. Examples of Nitride based ceramics include AN, SiN, and so on. IAD coating target material can be calcined powders, preformed lumps (e.g., formed by green body pressing, hot pressing, and so on), a sintered body (e.g., having 50-100% density), or a machined body (e.g., can be ceramic, metal, or a metal alloy).

As illustrated, the ring 146 has a thin film protective layer 133, 134, in accordance with one embodiment. However, it should be understood that any of the other chamber components, such as those listed above, may also include a thin film protective layer.

In one embodiment, the processing chamber 100 includes a chamber body 102 and a lid 130 that enclose an interior volume 106. The lid 130 may have a hole in its center, and a nozzle 132 may be inserted into the hole. The chamber body 102 may be fabricated from aluminum, stainless steel or other suitable material. The chamber body 102 generally includes sidewalls 108 and a bottom 110.

An outer liner 116 may be disposed adjacent the sidewalls 108 to protect the chamber body 102. The outer liner 116 may be fabricated and/or coated with a thin film protective layer. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 130 may be supported on the sidewall 108 of the chamber body 102. The lid 130 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the nozzle 132. The lid 130 may be a ceramic such as $Al_2O_3$, $Y_2O_3$, YAG, $SiO_2$, AN, SiN, SiC, Si—SiC, or a ceramic compound comprising $Y_4Al_2O_9$ and a solid-solution of $Y_2O_3$—$ZrO_2$. The nozzle 132 may also be a ceramic, such as any of those ceramics mentioned for the lid.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the lid 130. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment. The ring 146 includes the thin film protective layer 147.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116. Additionally, the inner liner 118 may be coated with a thin film protective layer.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, that may be formed in an upper surface of the puck 166. The gas passages may be fluidly coupled to a source of a heat transfer (or backside) gas such as He via holes drilled in the puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

Figure 2A:
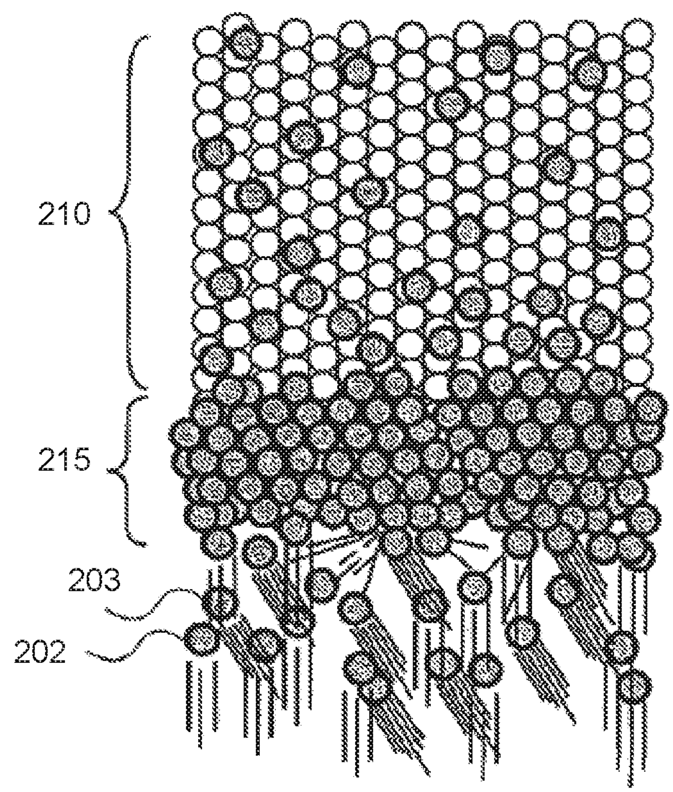
FIG. 2A depicts a deposition mechanism applicable to a variety of deposition techniques utilizing energetic particles such as ion assisted deposition (IAD).

FIG. 2A depicts a deposition mechanism applicable to a variety of deposition techniques utilizing energetic particles such as ion assisted deposition (IAD). Exemplary IAD methods include deposition processes which incorporate ion bombardment, such as evaporation (e.g., activated reactive evaporation (ARE)) and sputtering in the presence of ion bombardment to form plasma resistant coatings as described herein. One particular type of IAD performed in embodiments is electron beam IAD (EB-IAD). Any of the IAD methods may be performed in the presence of a reactive gas species, such as $O_2$, $N_2$, halogens, etc. Such reactive species may burn off surface organic contaminants prior to and/or during deposition. Additionally, the IAD deposition process for ceramic target deposition vs. the metal target deposition can be controlled by partial pressure of $O_2$ ions in embodiments. For example a $Y_2O_3$ coating can be made by evaporation of a Y metal and bleeding of oxygen ions to form oxides the Yttrium material on the surface of the component. Alternatively, a ceramic target can be used with no oxygen or reduced oxygen.

As shown, a thin film protective layer 215 is formed on an article 210 or on multiple articles 210A, 210B by an accumulation of deposition materials 202 in the presence of energetic particles 203 such as ions. The deposition materials 202 may include atoms, ions, radicals, and so on. The energetic particles 203 may impinge and compact the thin film protective layer 215 as it is formed.

Figure 2B:
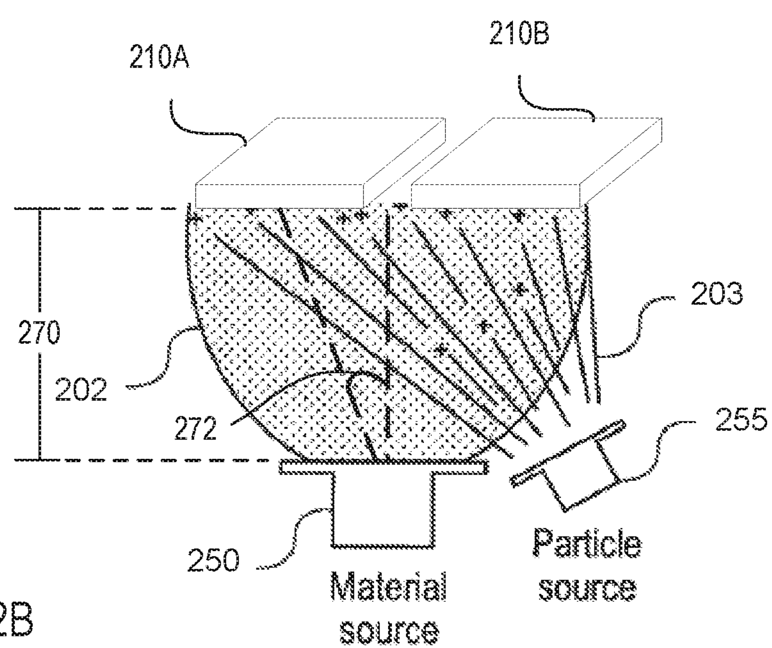
FIG. 2B depicts a schematic of an IAD deposition apparatus.

In one embodiment, EB IAD is utilized to form the thin film protective layer 215. FIG. 2B depicts a schematic of an IAD deposition apparatus. As shown, a material source 250 provides a flux of deposition materials 202 while an energetic particle source 255 provides a flux of the energetic particles 203, both of which impinge upon the article 210, 210A, 210B throughout the IAD process. The energetic particle source 255 may be an Oxygen or other ion source. The energetic particle source 255 may also provide other types of energetic particles such as inert radicals, neutron atoms, and nano-sized particles which come from particle generation sources (e.g., from plasma, reactive gases or from the material source that provide the deposition materials).

The material source (e.g., a target body) 250 used to provide the deposition materials 202 may be a bulk sintered ceramic corresponding to the same ceramic that the thin film protective layer 215 is to be composed of. For example, the material source may be a bulk sintered ceramic compound body, or bulk sintered YAG, $Er_2O_3$, $Gd_2O_3$, $Er_3Al_5O_{12}$, or $Gd_3Al_5O_{12}$, or other mentioned ceramics. Other target materials may also be used, such as powders, calcined powders, preformed material (e.g., formed by green body pressing or hot pressing), or a machined body (e.g., fused material). All of the different types of material sources 250 are melted into molten material sources during deposition. However, different types of starting material take different amounts of time to melt. Fused materials and/or machined bodies may melt the quickest. Preformed material melts slower than fused materials, calcined powders melt slower than preformed materials, and standard powders melt more slowly than calcined powders.

IAD may utilize one or more plasmas or beams (e.g., electron beams) to provide the material and energetic ion sources. Reactive species may also be provided during deposition of the plasma resistant coating. In one embodiment, the energetic particles 203 include at least one of non-reactive species (e.g., Ar) or reactive species (e.g., O). In further embodiments, reactive species such as CO and halogens (Cl, F, Br, etc.) may also be introduced during the formation of a plasma resistant coating to further increase the tendency to selectively remove deposited material most weakly bonded to the thin film protective layer 215.

With IAD processes, the energetic particles 203 may be controlled by the energetic ion (or other particle) source 255 independently of other deposition parameters. According to the energy (e.g., velocity), density and incident angle of the energetic ion flux, composition, structure, crystalline orientation and grain size of the thin film protective layer may be manipulated.

Additional parameters that may be adjusted are a temperature of the article during deposition as well as the duration of the deposition. In one embodiment, an IAD deposition chamber (and the chamber lid or nozzle therein) is heated to a starting temperature of 160° C. or higher prior to deposition. In one embodiment, the starting temperature is 160° C. to 500° C. In one embodiment, the starting temperature is 200° C. to 270° C. The temperature of the chamber and of the lid or nozzle may then be maintained at the starting temperature during deposition. In one embodiment, the IAD chamber includes heat lamps which perform the heating. In an alternative embodiment, the IAD chamber and lid or nozzle are not heated. If the chamber is not heated, it will naturally increase in temperature to about 160° C. as a result of the IAD process. A higher temperature during deposition may increase a density of the protective layer but may also increase a mechanical stress of the protective layer. Active cooling can be added to the chamber to maintain a low temperature during coating. The low temperature may be maintained at any temperature at or below 160° C. down to 0° C. in one embodiment.

Additional parameters that may be adjusted are working distance 270 and angle of incidence 272. The working distance 270 is the distance between the material source 250 and the article 210A, 210B. In one embodiment, the working distance is 0.2 to 2.0 meters, with a working distance of 1.0 meters in one particular embodiment. Decreasing the working distance increases a deposition rate and increases an effectiveness of the ion energy. However, decreasing the working distance below a particular point may reduce a uniformity of the protective layer. The angle of incidence is an angle at which the deposition materials 202 strike the articles 210A, 210B. In one embodiment the angle of incidence is 10-90 degrees, with an angle of incidence of about 30 degrees in one particular embodiment.

IAD coatings can be applied over a wide range of surface conditions with roughness from about 0.5 micro-inches (μin) to about 180 μin. However, smoother surface facilitates uniform coating coverage. The coating thickness can be up to about 300 microns (μm). In production, coating thickness on components can be assessed by purposely adding a rare earth oxide based colored agent such $Nd_2O_3$, $Sm_2O_3$, $Er_2O_3$, etc. at the bottom of a coating layer stack. The thickness can also be accurately measured using ellipsometry.

IAD coatings can be amorphous or crystalline depending on the rare-earth oxide composite used to create the coating. For example EAG and YAG are amorphous coatings whereas $Er_2O_3$ and the ceramic compound comprising $Y_4Al_2O_9$ and a solid-solution of $Y_2O_3$—$ZrO_2$ are typically crystalline. Amorphous coatings are more conformal and reduce lattice mismatch induced epitaxial cracks whereas crystalline coatings are more erosion resistant.

Coating architecture can be a bi-layer or a multi-layer structure. In a bilayer architecture, an amorphous layer can be deposited as a buffer layer to minimize epitaxial cracks followed by a crystalline layer on the top which might be erosion resistant. In a multi-layer design, layer materials may be used to cause a smooth thermal gradient from the substrate to the top layer.

Co-deposition of multiple targets using multiple electron beam (e-beam) guns can be achieved to create thicker coatings as well as layered architectures. For example, two targets having the same material type may be used at the same time. Each target may be bombarded by a different electron beam gun. This may increase a deposition rate and a thickness of the protective layer. In another example, two targets may be different ceramic materials. A first electron beam gun may bombard a first target to deposit a first protective layer, and a second electron beam gun may subsequently bombard the second target to form a second protective layer having a different material composition than the first protective layer.

Post coating heat treatment can be used to achieve improved coating properties. For example, it can be used to convert an amorphous coating to a crystalline coating with higher erosion resistance. Another example is to improve the coating to substrate bonding strength by formation of a reaction zone or transition layer.

In one embodiment, multiple rings are processed in parallel in an IAD chamber. For example, up to five rings may be processed in parallel in one embodiment. Each ring may be supported by a different fixture. Alternatively, a single fixture may be configured to hold multiple rings. The fixtures may move the supported rings during deposition.

In one embodiment, a fixture to hold a ring can be designed out of metal components such as cold rolled steel or ceramics such as $Al_2O_3$, $Y_2O_3$, etc. The fixture may be used to support the ring above or below the material source and electron beam gun. The fixture can have a chucking ability to chuck the ring for safer and easier handling as well as during coating. Also, the fixture can have a feature to orient or align the ring. In one embodiment, the fixture can be repositioned and/or rotated about one or more axes to change an orientation of the supported ring to the source material. The fixture may also be repositioned to change a working distance and/or angle of incidence before and/or during deposition. The fixture can have cooling or heating channels to control the ring temperature during coating. The ability or reposition and rotate the ring may enable maximum coating coverage of 3D surfaces of the rings since IAD is a line of sight process.

Figure 3:
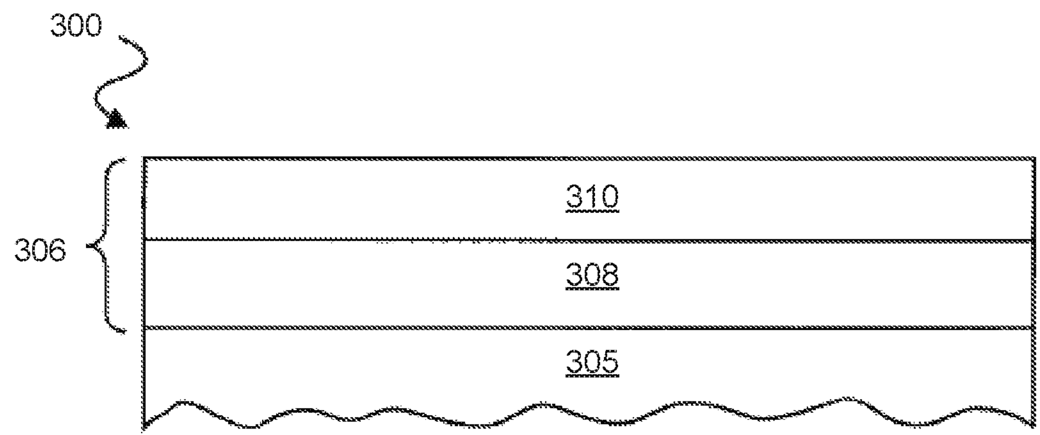
FIGS. 3-4 illustrate cross sectional side views of articles (e.g., process kit rings) covered by one or more thin film protective layers.
Figure 4:
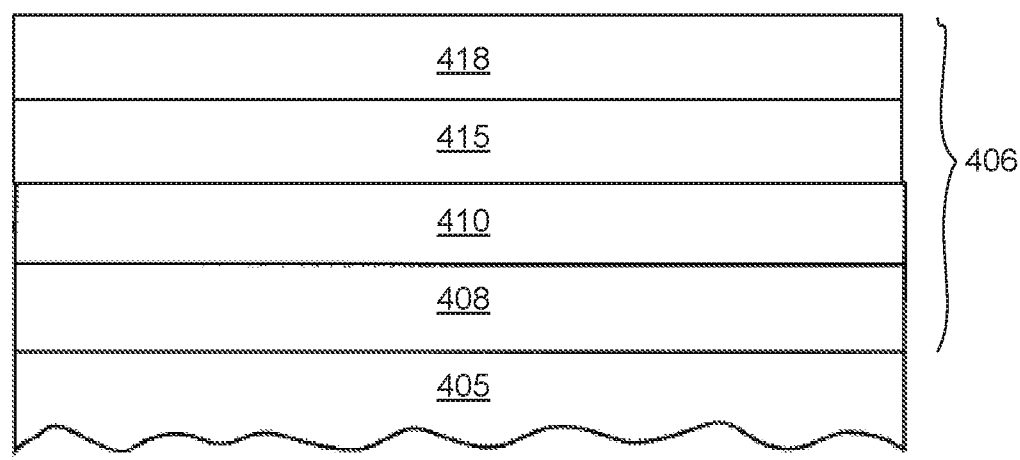

FIGS. 3-4 illustrate cross sectional side views of articles (e.g., rings) covered by one or more thin film protective layers. A single ring, insert ring or other process kit ring for a plasma etch reactor used for conductor etch and dielectric etch processes is typically Si or $SiO_2$. However, Si and $SiO_2$ have high erosion rates when exposed to various etch chemistries. Other materials may also be used for the rings.

Referring to FIG. 3, a body 305 of the article 300 includes a thin film stack 306 having a first thin film protective layer 308 and a second thin film protective layer 310. Alternatively, the article 300 may include only a single thin film protective layer 308 on the body 305. In one embodiment, the thin film protective layers 308, 310 have a thickness of up to about 300 μm. In a further embodiment, the thin film protective layers have a thickness of below about 20 microns, and a thickness between about 0.5 microns to about 7 microns in one particular embodiment. A total thickness of the thin film protective layer stack in one embodiment is 300 μm or less.

The thin film protective layers 308, 310 are deposited ceramic layers that may be formed on the body 305 of the article 300 using an electron beam ion assisted deposition (EB-IAD) process. The EB-IAD deposited thin film protective layers 308, 310 may have a relatively low film stress (e.g., as compared to a film stress caused by plasma spraying or sputtering). The relatively low film stress may cause the lower surface of the body 305 to be very flat, with a curvature of less than about 50 microns over the entire body for a body with a 12 inch diameter. The IAD deposited thin film protective layers 308, 310 may additionally have a porosity that is less than 1%, and less than about 0.1% in some embodiments. Therefore, the IAD deposited protective layer is a dense structure, which can have performance benefits for application on rings used in a plasma etch reactor. Additionally, the IAD deposited protective layer may have a low crack density and a high adhesion to the body 305. Additionally, the IAD deposited protective layers 308, 310 may be deposited without first roughening the upper surface of the body 305 or performing other time consuming surface preparation steps.

Examples of ceramics that may be used to form the thin film protective layer 208 include $Y_3Al_5O_{12}$, $Y_4Al_2O_9$, $Er_2O_3$, $Gd_2O_3$, $Er_3Al_5O_{12}$, $Gd_3Al_5O_{12}$, a ceramic compound comprising $Y_4Al_2O_9$ and a solid-solution of $Y_2O_3$—$ZrO_2$ ($Y_2O_3$—$ZrO_2$ solid solution), or any of the other ceramic materials previously identified. Other Er based and/or Gd based plasma resistant rare earth oxides may also be used to form the thin film protective layers 308, 310. In one embodiment, the same ceramic material is not used for two adjacent thin film protective layers. However, in another embodiment adjacent layers may be composed of the same ceramic.

Rings having IAD thin film protective layers may be used in applications that apply a wide range of temperatures. For example, rings with IAD thin film protective layers may be used in processes having temperatures at 0° C. to temperatures at 1000° C. The rings may be used at high temperatures (e.g., at or above 300° C.) without cracking caused by thermal shock.

TABLE 1

Material properties for IAD deposited YAG, $Er_2O_3$, EAG and ceramic compound comprising $Y_4Al_2O_9$ and a solid-solution of $Y_2O_3$—$ZrO_2$.

| Property | 92% $Al_2O_3$ | Ceramic Cmpd. | YAG | $Er_2O_3$ | EAG | $Y_2O_3$ | YZ20 | $YF_3$ |
|---|---|---|---|---|---|---|---|---|
| Crystal Structure | C | A | A | C | A | C | C | A |
| Breakdown Voltage (V) | 363 | 427 | 1223 | 527 (5 μm) | 900 (5 μm) | 1032 (5 μm) | 423 | 522 |
| Volume Resistivity (Ω · cm) | >0.01E16 | 4.1E16 | 11.3E16 | — | — | — | — | — |
| Dielectric Constant | 9.2 | 9.83 +/− 0.04 | 9.76 +/− 0.01 | 9.67 | 9.54 | — | — | — |
| Loss Tangent | 5E−4 | 4E−4 | 4E−4 | 4E−4 | 4E−4 | — | — | — |
| Thermal Conductivity (W/m-K) | 18 | 19.9 | 20.1 | 19.4 | 19.2 | — | — | — |
| Roughness (μin) | 8-16 | Same | Same | Same | Same | Same | Same | Same |
| Adhesion Over 92% $Al_2O_3$ (MPa) | N/A | >28 | >32 | — | — | — | — | — |
| Hermicity (leak rate) ($cm^3/s$) | <1E−6 | 1.2E−9 | 4.4E−10 | 5.5E−9 | 9.5E−10 | — | 1.6E−7 | 2.6E−9 |
| Hardness (GPa) | 12.14 | 7.825 | 8.5 | 5.009 | 9.057 | — | 5.98 | 3.411 |
| Wear Rate (nm/RFhr) | 0.2 | 0.14 | 0.28 | 0.113 | 0.176 | — | — | — |

Table 1 shows material properties for a substrate of 92% $Al_2O_3$ (alumina) and for various IAD thin film protective layers coating a substrate of 92% $Al_2O_3$. In the table "C" represents a crystalline structure and "A" represents an amorphous structure. As shown, the alumina substrate has a breakdown voltage of 363 Volts/mil (V/mil). In contrast, a 5 micron (μm) coating of the IAD deposited ceramic compound comprising $Y_4Al_2O_9$ and a solid-solution of $Y_2O_3$—$ZrO_2$ has a breakdown voltage of 427 V (much more than the normalized value of 363 Volts/mil for alumina). A 5 μm coating of the IAD deposited YAG has a breakdown voltage of 1223 V. A 5 μm coating of the IAD deposited $Er_2O_3$ has a breakdown voltage of 527 V. A 5 μm coating of the IAD deposited EAG has a breakdown voltage of 900 V. A 5 μm coating of the IAD deposited $Y_2O_3$ has a breakdown voltage of 1032 V. A 5 μm coating of the IAD deposited YZ20 has a breakdown voltage of 423 V. A 5 μm coating of the IAD deposited $YF_3$ has a breakdown voltage of 522V.

A volume resistivity of the alumina is around $0.01\times10^{16}$ (0.01E16) Ω·cm at room temperature. A volume resistivity of the ceramic compound thin film protective layer is about 4.1E16 Ω·cm at room temperature, and a volume resistivity of the YAG thin film protective layer is about 11.3E16 Ω·cm at room temperature.

A dielectric constant of the alumina is about 9.2, a dielectric constant of the ceramic compound thin film is about 9.83, a dielectric constant of the YAG thin film is about 9.76, a dielectric constant of the $Er_2O_3$ thin film is about 9.67, and a dielectric constant of the EAG thin film is about 9.54. A loss tangent of the alumina is about 5E-4, a loss tangent of the ceramic compound thin film is about 4E-4, a loss tangent of the YAG thin film is about 4E-4, a loss tangent of the $Er_2O_3$ thin film is about 4E-4, and a loss tangent of the EAG thin film is about 4E-4. A thermal conductivity of the alumina is about 18 W/m-K, a thermal conductivity of the ceramic compound thin film is about 19.9 W/m-K, a thermal conductivity of the YAG thin film is about 20.1 W/m-K, a thermal conductivity of the $Er_2O_3$ thin film is about 19.4 W/m-K, and a thermal conductivity of the EAG thin film is about 19.2 W/m-K.

The alumina substrate may have a starting roughness of approximately 8-16 micro-inches in one embodiment, and that starting roughness may be approximately unchanged in all of the thin film protective layers. The protective layer may be polished to reduce a surface roughness (e.g., an average surface roughness) to 8 micro-inches or below after deposition. In one embodiment, the protective layer is polished to an average surface roughness of 5-6 micro-inches or below using a flame polish. In one embodiment, the flame polish polishes the protective layer to an average surface roughness of 2-3 micro-inches.

Adhesion strength of the thin film protective layers to the alumina substrate may be above 28 mega pascals (MPa) for the ceramic compound thin film and above 32 MPa for the YAG thin film. Adhesion strength may be determined by measuring the amount of force used to separate the thin film protective layer from the substrate. Hermicity measures the sealing capacity that can be achieved using the thin film protective layer. As shown, a He leak rate of around 1E-6 cubic centimeters per second ($cm^3/s$) can be achieved using alumina, a He leak rate of around 1.2E-9 can be achieved using the ceramic compound, a He leak rate of around 4.4E-10 can be achieved using YAG, a He leak rate of around 5.5E-9 can be achieved using $Er_2O_3$, a He leak rate of around 2.6E-9 can be achieved using YF3, a He leak rate of around 1.6E-7 can be achieved using YZ20, and a He leak rate of around 9.5E-10 can be achieved using EAG. Lower He leak rates indicate an improved seal. Each of the example thin film protective layers has a lower He leak rate than typical $Al_2O_3$.

Each of $Y_3Al_5O_{12}$, $Y_4Al_2O_9$, $Er_2O_3$, $Gd_2O_3$, $Er_3Al_5O_{12}$, $Gd_3Al_5O_{12}$, and the ceramic compound comprising $Y_4Al_2O_9$ and a solid-solution of $Y_2O_3$—$ZrO_2$ have a high hardness that may resist wear during plasma processing. As shown, alumina has a Vickers hardness (5 Kgf) of around 12.14 Giga pascals (GPa), the ceramic compound has a hardness of around 7.825 GPa, YAG has a hardness of around 8.5 GPa, $Er_2O_3$ has a hardness of around 5.009 GPa, YZ20 has a hardness of around 5.98 GPa, $YF_3$ has a hardness of around 3.411 GPa and EAG has a hardness of around 9.057 GPa, A measured wear rate of alumina is around 0.2 nanometers per radio frequency hour (nm/RFhr), a wear rate of the ceramic compound is about 0.14 nm/RFhr, a wear rate of $Er_2O_3$ is about 0.113 nm/RFhr, and a wear rate of EAG is about 0.176 nm/RFhr.

Note that the $Y_3Al_5O_{12}$, $Y_4Al_2O_9$, $Er_2O_3$, $Gd_2O_3$, $Er_3Al_5O_{12}$, $Gd_3Al_5O_{12}$, and the ceramic compound may be modified such that the material properties and characteristics identified above may vary by up to 30% in some embodiments. Accordingly, the described values for these material properties should be understood as example achievable values. The ceramic thin film protective layers described herein should not be interpreted as being limited to the provided values.

FIG. 4 illustrates a cross sectional side view of another embodiment of an article 400 having a thin film protective layer stack 406 deposited over a body 405 of the article 400. Article 400 is similar to article 400, except that thin film protective layer stack 406 has four thin film protective layers 408, 410, 415, 418.

The thin film protective layer stacks (such as those illustrated) may have any number of thin film protective layers. The thin film protective layers in a stack may all have the same thickness, or they may have varying thicknesses. Each of the thin film protective layers may have a thickness of less than approximately 20 microns in some embodiments. In one example, a first layer 408 may have a thickness of 6 microns, and a second layer 410 may have a thickness of 6 microns. In another example, first layer 408 may be a YAG layer having a thickness of 3 microns, second layer 410 may be a compound ceramic layer having a thickness of 3 microns, third layer 415 may be a YAG layer having a thickness of 3 microns, and fourth layer 418 may be a compound ceramic layer having a thickness of 3 microns.

The selection of the number of ceramic layers and the composition of the ceramic layers to use may be based on a desired application and/or a type of article being coated. EAG and YAG thin film protective layers formed by IAD typically have an amorphous structure. In contrast, the IAD deposited compound ceramic and $Er_2O_3$ layers typically have a crystalline or nano-crystalline structure. Crystalline and nano-crystalline ceramic layers may generally be more erosion resistant than amorphous ceramic layers. However, in some instances thin film ceramic layers having a crystalline structure or nano-crystalline structure may experience occasional vertical cracks (cracks that run approximately in the direction of the film thickness and approximately perpendicular to the coated surface). Such vertical cracks may be caused by lattice mismatch and may be points of attack for plasma chemistries. Each time the article is heated and cooled, the mismatch in coefficients of thermal expansion between the thin film protective layer and the substrate that it coats can cause stress on the thin film protective layer. Such stress may be concentrated at the vertical cracks. This may cause the thin film protective layer to eventually peel away from the substrate that it coats. In contrast, if there are not vertical cracks, then the stress is approximately evenly distributed across the thin film. Accordingly, in one embodiment a first layer 408 in the thin film protective layer stack 406 is an amorphous ceramic such as YAG or EAG, and the second layer 410 in the thin film protective layer stack 406 is a crystalline or nano-crystalline ceramic such as the ceramic compound or $Er_2O_3$. In such an embodiment, the second layer 410 may provide greater plasma resistance as compared to the first layer 408. By forming the second layer 410 over the first layer 408 rather than directly over the body 405, the first layer 408 acts as a buffer to minimize lattice mismatch on the subsequent layer. Thus, a lifetime of the second layer 410 may be increased.

In another example, each of the body, $Y_3Al_5O_{12}$ (YAG), $Y_4Al_2O_9$, $Er_2O_3$, $Gd_2O_3$, $Er_3Al_5O_{12}$, $Gd_3Al_5O_{12}$, the ceramic compound comprising $Y_4Al_2O_9$ and a solid-solution of $Y_2O_3$—$ZrO_2$, and other ceramics may have a different coefficient of thermal expansion. The greater the mismatch in the coefficient of thermal expansion between two adjacent materials, the greater the likelihood that one of those materials will eventually crack, peel away, or otherwise lose its bond to the other material. The protective layer stacks 306, 406 may be formed in such a way to minimize mismatch of the coefficient of thermal expansion between adjacent layers (or between a layer and a body 305, 405). For example, body 405 may be alumina, and EAG may have a coefficient of thermal expansion that is closest to that of alumina, followed by the coefficient of thermal expansion for YAG, followed by the coefficient of thermal expansion for the compound ceramic. Accordingly, first layer 408 may be EAG, second layer 410 may be YAG, and third layer 415 may be the compound ceramic in one embodiment.

In another example, the layers in the protective layer stack 406 may be alternating layers of two different ceramics. For example, first layer 408 and third layer 415 may be YAG, and second layer 410 and fourth layer 418 may be the compound ceramic. Such alternating layers may provide advantages similar to those set forth above in cases where one material used in the alternating layers is amorphous and the other material used in the alternating layers is crystalline or nano-crystalline.

In some embodiments, one of more of the layers in the thin film protective layer stacks 306, 406 are transition layers formed using a heat treatment. If the body 305, 405 is a ceramic body, then a high temperature heat treatment may be performed to promote interdiffusion between a thin film protective layer and the body. Additionally, the heat treatment may be performed to promote interdiffusion between adjacent thin film protective layers or between a thick protective layer and a thin film protective layer. Notably, the transition layer may be a non-porous layer. The transition layer may act as a diffusion bond between two ceramics, and may provide improved adhesion between the adjacent ceramics. This may help prevent a protective layer from cracking, peeling off, or stripping off during plasma processing.

The thermal treatment may be a heat treatment at up to about 1400-1600 degrees C. for a duration of up to about 24 hours (e.g., 3-6 hours in one embodiment). This may create an inter-diffusion layer between a first thin film protective layer and one or more of an adjacent ceramic body or second thin film protective layer. If the ceramic body is $Al_2O_3$, and the protective layer is composed of a compound ceramic $Y_4Al_2O_9$ (YAM) and a solid solution $Y_2$-$xZr_xO_3$ ($Y_2O_3$—$ZrO_2$ solid solution), then a $Y_3Al_5O_{12}$ (YAG) interface layer will be formed. Similarly, a heat treatment will cause a transition layer of EAG to form between $Er_2O_3$ and $Al_2O_3$. A heat treatment will also cause a transition layer of YAG to form between $Y_2O_3$ and $Al_2O_3$. A heat treatment may also cause GAG to form between $Gd_2O_3$ and $Al_2O_3$. A heat treatment of yttria stabilized zirconia (YSZ) over $Al_2O_3$ can form a transition layer of the compound ceramic of $Y_4Al_2O_9$ (YAM) and a solid solution $Y_2$-$xZr_xO_3$. Other transition layers may be formed between other adjacent ceramics.

In one embodiment, a coloring agent is added during the deposition of the first protective layer 308, 408. Accordingly, when the second protective layer 310, 410 wears away, an operator may have a visual queue that it is time to refurbish or exchange the lid or nozzle.

Figure 5:
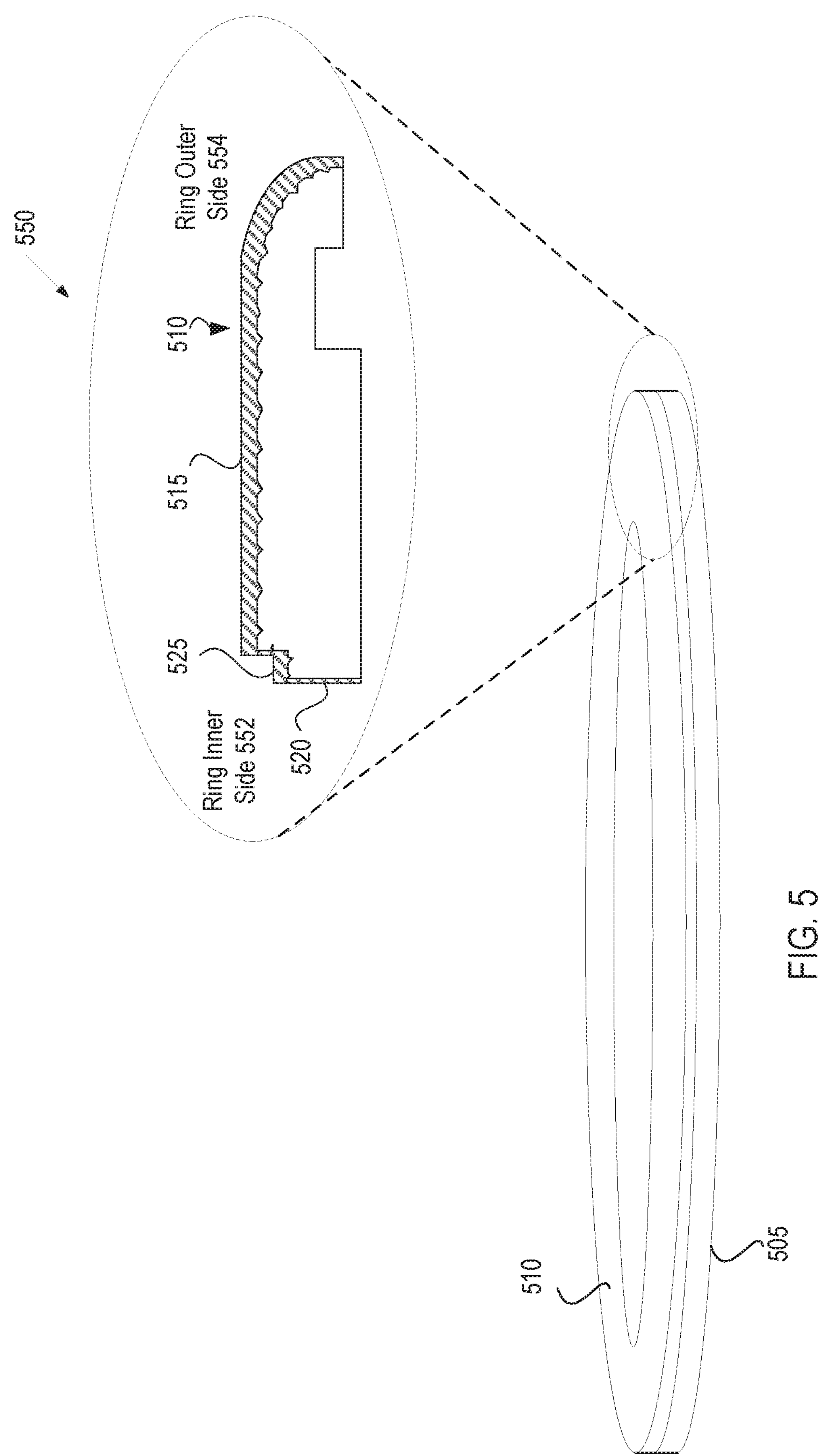
FIG. 5 illustrates a perspective view of a process ring having a rare earth oxide plasma resistant layer, in accordance with one embodiment.

FIG. 5 illustrates a perspective view of a single ring 505 having a thin film rare earth oxide plasma resistant layer

510, in accordance with one embodiment. A zoomed in view 550 of the single ring 505 is also shown. The single ring 505 includes a ring inner side 552 and a ring outer side 554. A plasma facing surface of the single ring 505 is coated by the thin film protective layer 510. The thin film protective layer 510 may also coat the ring outer side 554, which may also be exposed to plasma during processing. The protective layer 510 at a top flat region 515 of the ring 505 may be uniform, dense, and conforming, and may have no cracking and no delamination. The dense coating may have a porosity of zero or close to zero (e.g., below 0.01%). In one embodiment, the thin film protective layer has a thickness of about 5 microns at the top flat region 515. Alternatively, the thin film protective layer may be thicker.

The thin film protective layer 510 may coat one or more step 525 on the ring inner side 552. The illustrated example shows a single step 525, but the ring inner side 552 may alternatively have two or more steps. The protective layer 510 at the step 525 of the ring 505 may be uniform, dense, and conforming, and may have no cracking and no delamination. The dense coating may have a porosity of zero or close to zero (e.g., below 0.01%). In one embodiment, the thin film protective layer 510 has a thickness of about 5 microns at the step 525. Alternatively, the thin film protective layer may be thicker.

In some embodiments, the thin film protective layer 510 coats vertical walls 520 of the ring inner side 552. Alternatively, the thin film protective layer 510 may not coat the vertical walls 520. The protective layer 510 at the vertical walls 520 of the ring 505 may be uniform, dense, and conforming, and may have no cracking and no delamination. The dense coating may have a porosity of zero or close to zero (e.g., below 0.01%). In one embodiment, the thin film protective layer 510 has a thickness of about 3 microns at the vertical walls 520. Alternatively, the thin film protective layer at the vertical walls may be thicker. In one embodiment a thickness of the thin film protective coating at the vertical walls is 45%-70% the thickness of the thin film protective layer at the top flat region 515 and at the step 525. In a further embodiment, the thickness of the thin film protective coating at the vertical walls is 55%-60% the thickness of the thin film protective layer at the top flat region 515 and at the step 525.

The single ring 505 may have a surface roughness of 16 micro-inches or higher. However, the thin film protective layer 510 may be flame polished to achieve a surface roughness of about 2-3 micro-inches in one embodiment. The flame polish process may cause the protective layer to melt and reflow at the surface to achieve the low surface roughness.

Figure 6:
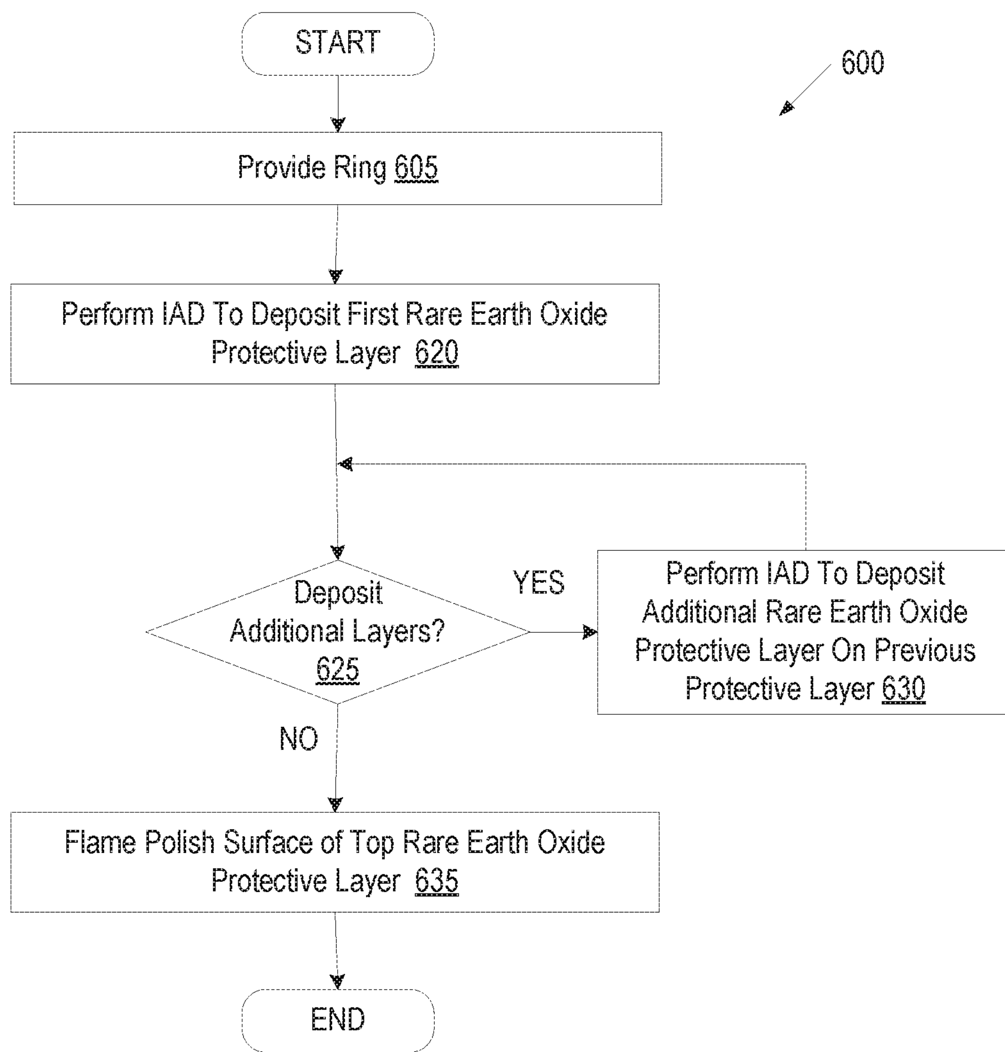
FIG. 6 illustrates one embodiment of a process for forming one or more protective layers over a ring.

FIG. 6 illustrates one embodiment of a process 600 for forming a thin film protective layer over a body of a ring such as a single ring or insert ring for a plasma etch reactor. At block 605 of process 600, a ring is provided. The ring may have a bulk sintered ceramic body. The bulk sintered ceramic body may be $Al_2O_3$, $Y_2O_3$, $SiO_2$, or the ceramic compound comprising $Y_4Al_2O_9$ and a solid-solution of $Y_2O_3$—$ZrO_2$. The ring may also be Si, SiC, or other materials.

At block 620, an ion assisted deposition (IAD) process is performed to deposit a rare earth oxide protective layer onto at least one surface of the ring. In one embodiment, an electron beam ion assisted deposition process (EB-IAD) is performed. The IAD process may be performed by melting a material that is to be deposited and bombarding the material with ions.

The thin film protective layer may be $Y_3Al_6O_{12}$, $Y_4Al_2O_9$, $Er_2O_3$, $Gd_2O_3$, $Er_3Al_6O_{12}$, $Gd_3Al_6O_{12}$, or the ceramic compound of $Y_4Al_2O_9$ and a solid-solution of $Y_2O_3$—$ZrO_2$, or other rare earth oxides described herein. A deposition rate for the thin film protective layer may be about 0.02-20 Angstroms per second (A/s) in one embodiment, and may be varied by tuning deposition parameters. In one embodiment, a deposition rate of 0.25-1 A/s is initially used to achieve a conforming well adhering coating on the substrate. A deposition rate of 2-10 A/s may then be used for depositing a remainder of a thin film protective layer to achieve a thicker coating in a shorter time. The thin film protective layers may be very conforming, may be uniform in thickness, and may have a good adhesion to the body/substrate that they are deposited on.

In one embodiment, the material includes a coloring agent that will cause the deposited protective layer to have a particular color. Examples of coloring agents that may be used include $Nd_2O_3$, $Sm_2O_3$ and $Er_2O_3$. Other coloring agents may also be used.

At block 625, a determination is made regarding whether to deposit any additional thin film protective layers. If an additional thin film protective layer is to be deposited, the process continues to block 630. At block 630, another thin film protective layer is formed over the first thin film protective layer. The other thin film protective layer may be composed of a ceramic that is different than a ceramic of the first thin film protective layer. Alternatively, the other thin film protective layer may be composed of the same ceramic or ceramics that were used to form the first protective layer.

In one embodiment, the other thin film protective layer does not include any coloring agent. Accordingly, the subsequent protective layers may have a different color than the bottom protective layer, even if they are composed of the almost the same ceramic materials. This causes the ring to change color when the protective layer stack is eroded down to the bottom protective layer. The change in color may signal to an operator that it is time to change the ring of a processing chamber.

After a subsequent protective layer is deposited, the method returns to block 625. If at block 625 no additional thin film protective layers are to be applied, the process proceeds to block 635. At block 635, a surface of the protective layer is polished using a flame polish process. In one embodiment, the surface of the top protective layer is polished to a surface roughness of below 8 micro-inches. In another embodiment, the surface of the top protective layer is polished to a surface of about 2-3 micro-inches.

Process 600 may be performed on new rings or on used rings to refurbish the used rings. In one embodiment, used rings are polished before performing process 600. For example, previous protective layers may be removed by polishing before performing process 600.

With IAD processes, the energetic particles may be controlled by the energetic ion (or other particle) source independently of other deposition parameters. According to the energy (e.g., velocity), density and incident angle of the energetic ion flux, composition, structure, crystalline orientation and grain size of the thin film protective layer may be manipulated. Additional parameters that may be adjusted are a temperature of the article during deposition as well as the duration of the deposition. The ion energy may be roughly categorized into low energy ion assist and high energy ion assist. Low energy ion assist may include a voltage of about 230V and a current of about 5 A. High energy ion assist may include a voltage of about 270V and a current of about 7 A. The low and high energy for the ion assist is not limited to the values mentioned herein. The high and low level designation may additionally depend on the type of the ions used and/or the geometry of the chamber used to perform the IAD process. The ions are projected with a higher velocity with high energy ion assist than with low energy ion assist. Substrate (article) temperature during deposition may be roughly divided into low temperature (around 120-150° C. in one embodiment which is typical room temperature) and high temperature (around 270° C. in one embodiment). For high temperature IAD deposition processes, the ring may be heated prior to and during deposition.

TABLE 2A

Example Thin Film Protective Layers Formed Using IAD

| Material | Thk. (μm) | Dep. Rate (A/s) | Ion Assist | Temp. (° C.) | XRD | Vacuum ($cm^3/s$) | Hardness (GPa) |
|---|---|---|---|---|---|---|---|
| 1st Compound Ceramic (sintered plug) | 5 | 2 | 230V, 5A | 270 | C | N/A | 4.11 |
| 2nd Compound Ceramic (sintered plug) | 6 | 1 for 2 μm 2 for 4 μm | 230V, 5A | 270 | C + A | 5.0E−6 | |
| 3rd Compound Ceramic (sintered plug) | 5 | 1 | 230V, 5A | 270 | C + A | 6.3E−6 | |
| 4th Compound Ceramic (sintered plug) | 5 | 1 for 1 μm 2 for 4 μm | 270V, 7A | 270 | A | 1.2E−9 | 7.825 |
| 5th Compound Ceramic (calcined powder) | 5 | 1 for 1 μm 2 for 4 μm | 270V, 7A | 120-150 | A | 1.2E−9 | |
| 6th Compound Ceramic (calcined powder) | 5 | 1 for 1 μm 4 for 4 μm | 270V, 7A | 120-150 | A | 1.2E−9 | 7.812 |

TABLE 2B

Example Thin Film Protective Layers Formed Using IAD

| Material | Thk. (μm) | Dep. Rate (A/s) | Ion Assist | Temp. (° C.) | XRD | Vacuum ($cm^3/s$) | Hardness (GPa) |
|---|---|---|---|---|---|---|---|
| 1st YAG (fused lump) | 5 | 2.5 | 230V, 5A | 270 | A | 3.7E−7 | 5.7 |
| 2nd YAG (fused lump) | 5 | 1 for 1 μm 2 for 4 μm | 270V, 7A | 270 | A | 4.4E−10 | 8.5 |
| Compound Ceramic/ YAG | 5 | 2 | 230V, 5A | 270 | C +A | 3.7E−7 | |
| 1st $Er_2O_3$ (sintered lump) | 5 | 2 | 230V, 5A | 270 | C | 3E−6 | |
| 2nd $Er_2O_3$ (sintered lump) | 5 | 1 for 1 μm 2 for 4 μm | 270V, 7A | 270 | C | 5.5E−9 | 5.009 |
| 1st EAG (calcined powder) | 7.5 | 1 for 1 μm 2 for next | 270V, 7A | 270 | A | 9.5E−10 | 8.485 |
| 2nd EAG (calcined power) | 7.5 | 1 for 1 μm 2 for next | 270V, 7A | 120-150 | A | 2.5E−9 | 9.057 |
| 3rd EAG (calcined powder) | 5 | 1 for 1 μm 2 for 4 μm | 270V, 7A | | A | | |
| $Y_2O_3$ (fused lump) | 5 | 1 for 1 μm 2 for 4 μm | 270V, 7A | 270 | C | | |
| YZ20 (Powder) | 5 | 1 for 1 μm 2 for 4 μm | 270V, 7A | 120-150 | C | 1.6E−7 | 5.98 |
| $YF_3$ | 5 | 1 for 1 μm 2 for 4 μm | 270V, 7A | 120-150 | A | 2.6E−9 | 3.411 |

Tables 2A-2B show multiple example thin film protective layers formed using IAD with various deposition parameters. The experimental results identify an optimized coating process based on a multi-factorial design of experiments (DOE) that varies ion assisted energy, deposition rate and temperature to obtain a conforming, dense microstructure. The coatings are characterized in terms of material properties (microstructure and/or crystal phase) and mechanical properties (hardness and adhesion), as well as crack density and vacuum sealing capability. IAD coating process optimization can produce IAD coatings with high density thin-films (up to ~300 μm in thickness) with low residual stress. The optimized parameters can be used for most rare earth oxide based coating materials.

Six different examples are shown for thin film protective layers formed from the ceramic compound of $Y_4Al_2O_9$ and a solid-solution of $Y_2O_3$—$ZrO_2$. A first example compound ceramic thin film protective layer has a thickness of 5 microns, and was formed using IAD with a low energy ion assist and a sintered plug target, a deposition temperature of 270° C., and a deposition rate of 2 angstroms per seconds (A/s). X-ray diffraction showed that the first example compound ceramic thin film protective layer had a crystalline structure. The first example compound ceramic thin film protective layer also had a hardness of 4.11 GPa and visual inspection showed good conformance to the underlying substrate as well as some vertical cracks and some spikes.

A second example compound ceramic thin film protective layer has a thickness of 6 microns, and was formed using IAD with a low energy ion assist and a sintered plug target, a deposition temperature of 270° C., and a deposition rate of 1 A/s for the first 2 microns and a deposition rate of 2 A/s for the subsequent 4 microns. X-ray diffraction showed that the second example compound ceramic thin film protective layer had a nano-crystalline structure (in which portions are crystalline and portions are amorphous). When used as a seal, the second example compound ceramic thin film protective layer was able to maintain a vacuum down to 5E-6 cubic centimeters per second ($cm^3/s$). Visual inspection of the second example compound ceramic thin film protective layer showed good conformance and fewer vertical cracks than the first example compound ceramic thin film protective layer.

A third example compound ceramic thin film protective layer has a thickness of 5 microns, and was formed using IAD with a low energy ion assist and a sintered plug target, a deposition temperature of 270° C., and a deposition rate of 1 A/s. X-ray diffraction showed that the third example compound ceramic thin film protective layer had a nano-crystalline structure. When used as a seal, the third example compound ceramic thin film protective layer was able to maintain a vacuum down to 6.3E-6 $cm^3/s$. Visual inspection of the third example compound ceramic thin film protective layer showed good conformance and fewer vertical cracks than the first example compound ceramic thin film protective layer.

A fourth example compound ceramic thin film protective layer has a thickness of 5 microns, and was formed using IAD with a high energy ion assist and a sintered plug target, a deposition temperature of 270° C., and a deposition rate of 1 A/s for the first micron and 2 A/s for the subsequent 4 microns. X-ray diffraction showed that the third example compound ceramic thin film protective layer had an approximately amorphous structure. When used as a seal, the third example compound ceramic thin film protective layer was able to maintain a vacuum down to 1.2E-9 $cm^3/s$. Visual inspection of the fourth example compound ceramic thin film protective layer showed good conformance, a smooth surface and very few vertical cracks. Additionally, the fourth example compound ceramic thin film protective layer has a hardness of 7.825 GPa.

A fifth example compound thin film protective layer was formed using the same parameters as the fourth example compound thin film protective layer, but with a deposition temperature at room temperature (around 120-150° C.) and with a calcined powder target. The fifth example compound thin film protective layer showed similar properties to those of the fourth example compound thin film protective layer.

A sixth example compound ceramic thin film protective layer has a thickness of 5 microns, and was formed using IAD with a high energy ion assist and a calcined powder target, a deposition temperature of 270° C., and a deposition rate of 1 A/s for the first micron and 4 A/s for the subsequent 4 microns. X-ray diffraction showed that the third example compound ceramic thin film protective layer had an approximately amorphous structure. When used as a seal, the third example compound ceramic thin film protective layer was able to maintain a vacuum down to 1.2E-9 $cm^3/s$. The fourth example compound ceramic thin film protective layer has a hardness of 7.812 GPa.

A first example YAG thin film protective layer has a thickness of 5 microns, and was formed using IAD with a low energy ion assist and a fused lump target, a deposition temperature of 270° C., and a deposition rate of 2.5 A/s. X-ray diffraction showed that the first YAG ceramic thin film protective layer had an amorphous structure. The first YAG thin film protective layer also had a hardness of 5.7 GPa and visual inspection showed good conformance, minimal cracking and a smooth surface.

A second example YAG thin film protective layer has a thickness of 5 microns, and was formed using IAD with a high energy ion assist and a fused lump target, a deposition temperature of 270° C., and a deposition rate of 1 A/s for a first micron and 2 A/s for the subsequent 4 microns. X-ray diffraction showed that the second YAG thin film protective layer had an amorphous structure. The second YAG thin film protective layer also had a hardness of 8.5 GPa and visual inspection showed good conformance, reduced cracking compared to the first YAG thin film and a smooth surface.

An example thin film protective layer stack with alternating compound ceramic and YAG layers has a thickness of 5 microns, and was formed using IAD with a low energy ion assist, a deposition temperature of 270° C., and a deposition rate of 2 A/s. X-ray diffraction showed that the alternating layers were amorphous (for the YAG layers) and crystalline or nano-crystalline (for the compound ceramic layers). Visual inspection showed reduced vertical cracks for the compound ceramic layers.

A first example $Er_2O_3$ thin film protective layer has a thickness of 5 microns, and was formed using IAD with a low energy ion assist and a sintered lump target, a deposition temperature of 270° C., and a deposition rate of 2 A/s. X-ray diffraction showed that the first $Er_2O_3$ ceramic thin film protective layer had a crystalline structure. Visual inspection showed good conformance and a vertical cracking.

A second example $Er_2O_3$ thin film protective layer has a thickness of 5 microns, and was formed using IAD with a high energy ion assist and a sintered lump target, a deposition temperature of 270° C., and a deposition rate of 1 A/s for the first micron and a deposition rate of 2 A/s for the subsequent 4 microns. X-ray diffraction showed that the second $Er_2O_3$ ceramic thin film protective layer had a crystalline structure. Visual inspection showed good conformance and a less vertical cracking compared to the first $Er_2O_3$ ceramic thin film protective layer.

A first example EAG thin film protective layer has a thickness of 7.5 microns, and was formed using IAD with a high energy ion assist and a calcined powder target, a deposition temperature of 270° C., and a deposition rate of 1 A/s for the first micron and a deposition rate of 2 A/s for the subsequent microns. X-ray diffraction showed that the first EAG ceramic thin film protective layer had an amorphous structure, and the layer had a hardness of 8.485 GPa. Visual inspection showed good conformance and minimal cracking.

A second example EAG thin film protective layer has a thickness of 7.5 microns, and was formed using IAD with a high energy ion assist and a calcined powder target, a deposition temperature of 120-150° C., and a deposition rate of 1 A/s for the first micron and a deposition rate of 2 A/s for the subsequent microns. X-ray diffraction showed that the second EAG ceramic thin film protective layer had an amorphous structure, and the layer had a hardness of 9.057 GPa. Visual inspection showed good conformance and a less cracking compared to the first EAG ceramic thin film protective layer.

A third example EAG thin film protective layer has a thickness of 5 microns, and was formed using IAD with a high energy ion assist and a calcined powder target, and a deposition rate of 1 A/s for the first micron and a deposition rate of 2 A/s for the subsequent microns. X-ray diffraction showed that the third EAG ceramic thin film protective layer had an amorphous structure.

An example $Y_2O_3$ thin film protective layer has a thickness of 5 microns, and was formed using IAD with a high energy ion assist and a fused lump target, a temperature of 270° C., and a deposition rate of 1 A/s for the first micron and a deposition rate of 2 A/s for the subsequent microns. X-ray diffraction showed that the third EAG ceramic thin film protective layer had a crystalline structure.

An example YZ20 thin film protective layer has a thickness of 5 microns, and was formed using IAD with a high energy ion assist and a powder target, a temperature of 120-150° C., and a deposition rate of 1 A/s for the first micron and a deposition rate of 2 A/s for the subsequent microns. X-ray diffraction showed that the YZ20 ceramic thin film protective layer had a crystalline structure. When used as a seal, the YZ20 ceramic thin film protective layer was able to maintain a vacuum down to 1.6E-7 $cm^3/s$. The YZ20 ceramic thin film protective layer had a hardness of 5.98 GPa An example $YF_3$ thin film protective layer has a thickness of 5 microns, and was formed using IAD with a high energy ion assist, a temperature of 120-150° C., and a deposition rate of 1 A/s for the first micron and a deposition rate of 2 A/s for the subsequent microns. X-ray diffraction showed that the $YF_3$ ceramic thin film protective layer had an amorphous structure. When used as a seal, the $YF_3$ ceramic thin film protective layer was able to maintain a vacuum down to 2.6E-9 $cm^3/s$. The $YF_3$ ceramic thin film protective layer had a hardness of 3.411 GPa

TABLE 3

Ring Optimized Coating Process Parameters

| Parameter | Affects | Optimization | Range |
|---|---|---|---|
| Voltage (V) | Density & Conformance | 188 | 150-270 |
| Current (A) | Density & Conformance | 7 | 5-7 |
| Temperature (° C.) | Film Stress, Crystalinity | 150 | 100-270 |
| Deposition rate (A/s) | Conformance | 1 | 0.01-20 |
| Angle of incidence (degrees) | Ability to coat 3D geometry | 30 | 0-90 |
| Working distance (in.) | Coating thickness, deposition rate | 50 | 10-300 |

Table 3 shows optimized IAD processing parameters for coating a ring, in accordance with one embodiment. Table 3 additionally shows processing parameter ranges that may be used in some embodiments to deposit thin film protective layers. In one embodiment, an IAD process is performed using a voltage of 150-270 Volts (V), a current of 5-7 Amps (A), a temperature of 100-270° C., a deposition rate of 0.01-20 Angstroms per second (A/s), an angle of incidence of 0-90 degrees, and a working distance of 10-300 inches (in.). In another embodiment, an IAD process is performed using a voltage of 50-500V, a current of 1-50 A, a temperature of 20-500° C., a deposition rate of 0.01-20 A/s, a working distance of 10-300 inches, and an angle of incidence of 10-90 degrees.

The coating deposition rate can be controlled by adjusting an amount of heat that is applied by an electron beam. The ion assist energy may be used to densify the coating and to accelerate the deposition of material on the surface of the lid or nozzle. The ion assist energy can be modified by adjusting the voltage and/or the current of the ion source. The current and voltage can be adjusted to achieve high and low coating density, to manipulate the stress of the coating, and also to affect the crystalinity of the coating. Ion assist energies in the range of 50-500 V and 1-50 A may be used in some embodiments. Deposition rate may be varied from 0.01 to 20 A/s.

In one embodiment, a high ion assist energy used with a ceramic compound comprising $Y_4Al_2O_9$ and a solid-solution of $Y_2O_3$—$ZrO_2$ forms an amorphous protective layer and a low ion assist energy used with the ceramic compound comprising $Y_4Al_2O_9$ and a solid-solution of $Y_2O_3$—$ZrO_2$ forms a crystalline protective layer. The ion assist energy can also be used to change a stoichiometry of the protective layer. For example, a metallic target can be used, and during deposition metallic material converts to a metal oxide by the incorporation of oxygen ions at the surface of the lid or nozzle. Also, using an oxygen gun the level of any metal oxide coating can be changed and optimized to achieve desired coating properties. For example most rare earth oxides lose oxygen inside a vacuum chamber. By bleeding more oxygen inside the chamber the oxygen deficiency of the oxide coating material can be compensated.

Coating temperature can be controlled by using heaters (e.g., heat lamps) and by controlling the deposition rate. A higher deposition rate will typically cause the temperature of the lid or nozzle to increase. The deposition temperature can be varied to control a film stress, crystallinity, and so on. Temperature may be varied from 20° C. to 500° C.

The working distance can be adjusted to modify uniformity, density and deposition rate. Working distance may be varied from 10-300 inches. The deposition angle or angle of incidence can be varied by the location of the electron beam gun or electron beam hearth, or by changing a location of the lid or nozzle in relation to the electron beam gun or electron beam hearth. By optimizing the deposition angle, a uniform coating in three dimensional geometries can be achieved. Deposition angle can be varied from 0-90 degrees, and from 10-90 degrees in one particular embodiment.

In one embodiment, an IAD process is performed using a voltage of about 188 V in combination with other processing parameters having any of the associated processing parameter ranges. In one embodiment, an IAD process is performed using a current of about 7 A in combination with other processing parameters having any of the associated processing parameter ranges. In one embodiment, an IAD process is performed using temperature of about 150° C. in combination with other processing parameters having any of the associated processing parameter ranges. In one embodiment, an IAD process is performed using a deposition rate of about 1 A/s in combination with other processing parameters having any of the associated processing parameter ranges. In a further embodiment, a deposition rate of 2 A/s is used until a deposited thin film reaches a thickness of 1 μm, after which a deposition rate of 1 A/s is used. In another embodiment, a deposition rate of 0.25-1 A/s is initially used to achieve a conforming well adhering coating on the substrate. A deposition rate of 2-10 A/s may then be used for depositing a remainder of a thin film protective layer to achieve a thicker coating in a shorter time.

In one embodiment, an IAD process is performed using an angle of incidence of about 30 degrees in combination with other processing parameters having any of the associated processing parameter ranges. In one embodiment, an IAD process is performed using a working distance of about 50 inches in combination with other processing parameters having any of the associated processing parameter ranges.

Figure 7:
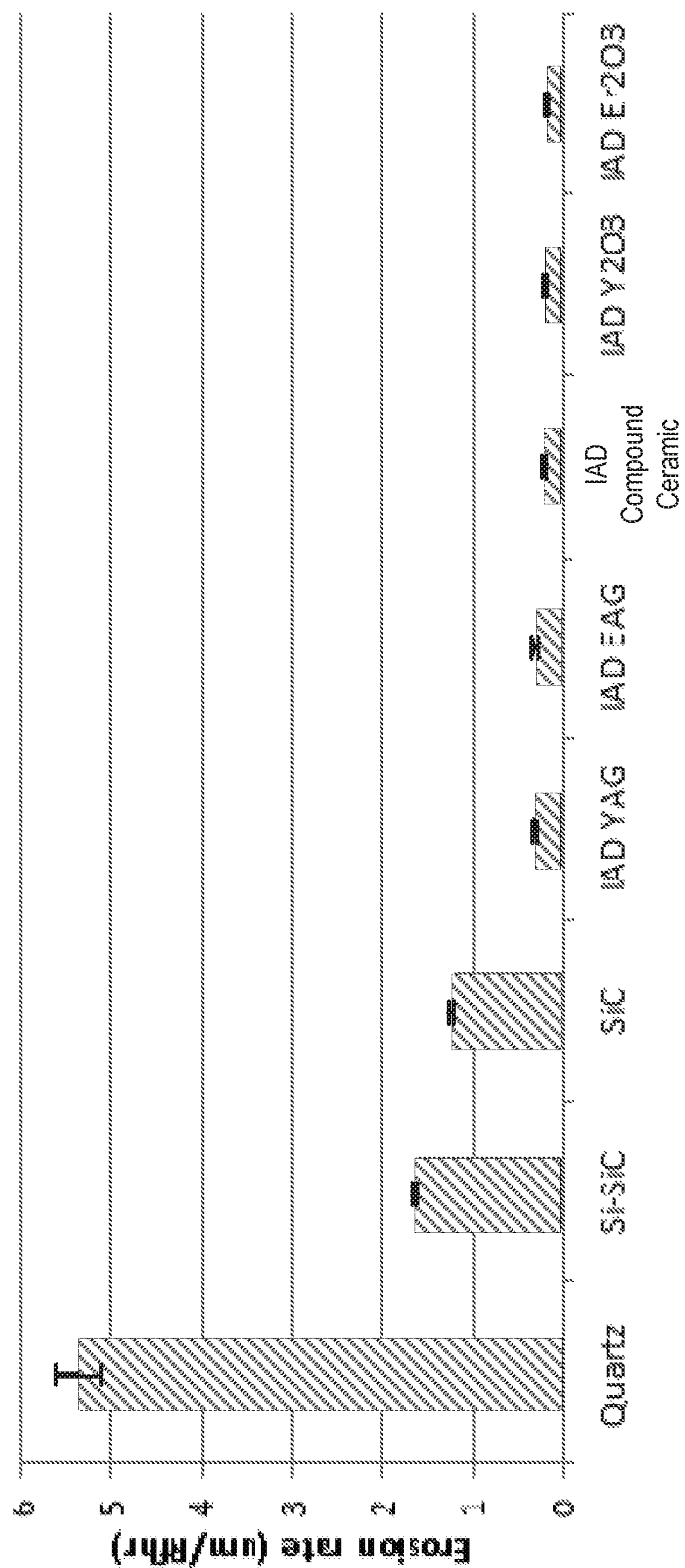
FIG. 7 shows erosion rates of various materials exposed to dielectric etch $CF_4$ chemistry, including erosion rates of multiple different IAD coatings generated in accordance with embodiments described herein.

FIG. 7 shows erosion rates of various materials exposed to dielectric etch $CF_4$ chemistry, including erosion rates of multiple different IAD coatings generated in accordance with embodiments described herein. As shown, an erosion rate of quartz is around 1.5.3 microns per radiofrequency hour (μm/Rfhr), an erosion rate of SiC is around 1.2 μm/Rfhr, an erosion rate of Si—SiC is around 1.2 μm/Rfhr, an erosion rate of IAD deposited YAG is around 0.2 μm/Rfhr, an erosion rate of IAD deposited EAG is about 0.24 μm/Rfhr, an erosion rate of IAD deposited compound ceramic is about 0.18 μm/Rfhr, an erosion rate of IAD deposited $Y_2O_3$ is about 0.18 μm/Rfhr, and an erosion rate of IAD deposited Er2O3 is about 0.18 μm/Rfhr. A radiofrequency hour is an hour of processing.

Figure 8:
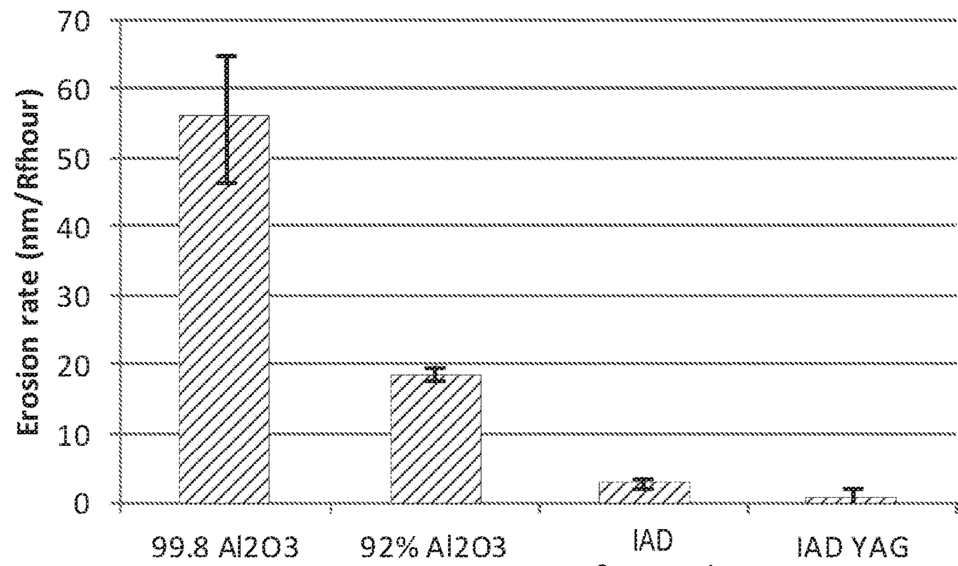
FIGS. 8-9 illustrate erosion rates for thin film protective layers formed in accordance with embodiments of the present invention.
Figure 9:
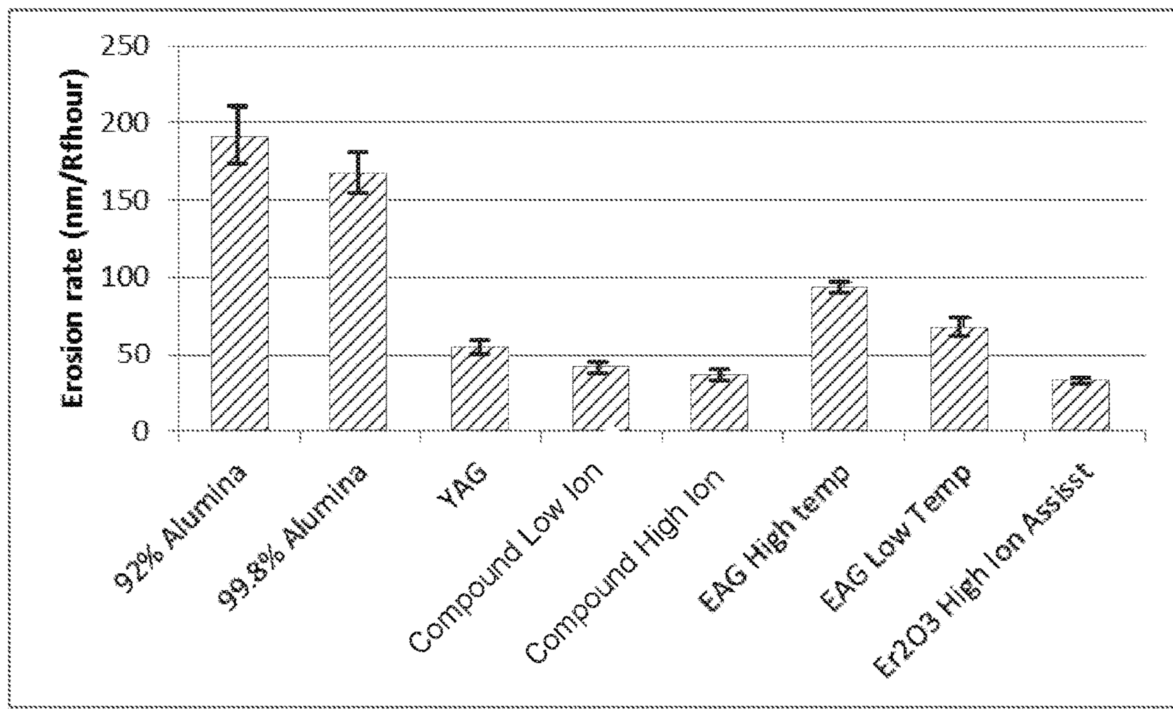

FIGS. 8-9 illustrate erosion rates for thin film protective layers formed in accordance with embodiments of the present invention. FIG. 8 shows erosion rates of thin film protective layers when exposed to a $CH_4/Cl_2$ plasma chemistry. As shown, the IAD deposited thin film protective layers show a much improved erosion resistance as compared to $Al_2O_3$. For example, alumina with a 92% purity showed an erosion rate of around 18 nanometers pre radiofrequency hour (nm/RFHr) and alumina with a 99.8% purity showed an erosion rate of about 56 nm/RFHr. In contrast an IAD deposited compound ceramic thin film protective layer showed an erosion rate of about 3 nm/RFHr and an IAD deposited YAG thin film protective layer showed an erosion rate of about 1 nm/RFHr.

FIG. 9 shows erosion rates of thin film protective layers when exposed to a $H_2/NF_3$ plasma chemistry. As shown, the IAD deposited thin film protective layers show a much improved erosion resistance as compared to $Al_2O_3$. For example, alumina with a 92% purity showed an erosion rate of around 190 nm/RFHr and alumina with a 99.8% purity showed an erosion rate of about 165 nm/RFHr. In contrast an IAD deposited YAG thin film protective layer showed an erosion rate of about 52 nm/RFHr. Similarly, a compound ceramic thin film protective layer deposited using IAD with low energy ions showed an erosion rate of about 45 nm/RFHr and a compound ceramic thin film protective layer deposited using IAD with high energy ions showed an erosion rate of about 35 nm/RFHr. An EAG thin film protective layer deposited using IAD with high deposition temperature (e.g., around 270° C.) showed an erosion rate of about 95 nm/RFHr and an EAG thin film protective layer deposited using IAD with low deposition temperature (e.g., around 120-150° C.) showed an erosion rate of about 70 nm/RFHr. An $Er_2O_3$ thin film protective layer deposited using IAD with high energy ions showed an erosion rate of about 35 nm/RFHr.

Figure 10:
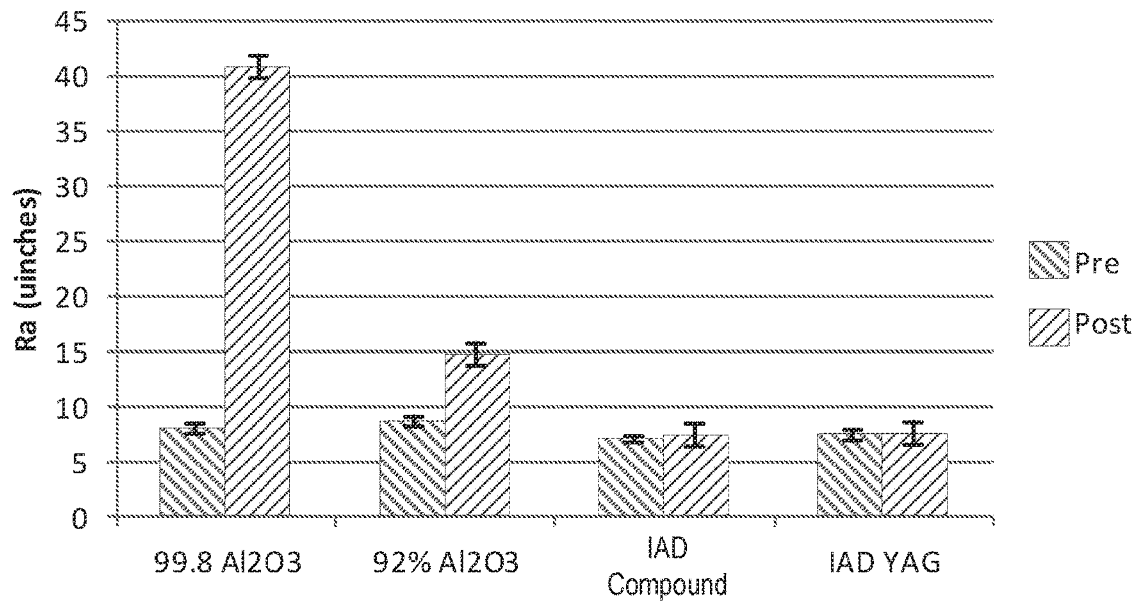
FIGS. 10-11 illustrate roughness profiles for thin film protective layers formed in accordance with embodiments of the present invention.
Figure 11:
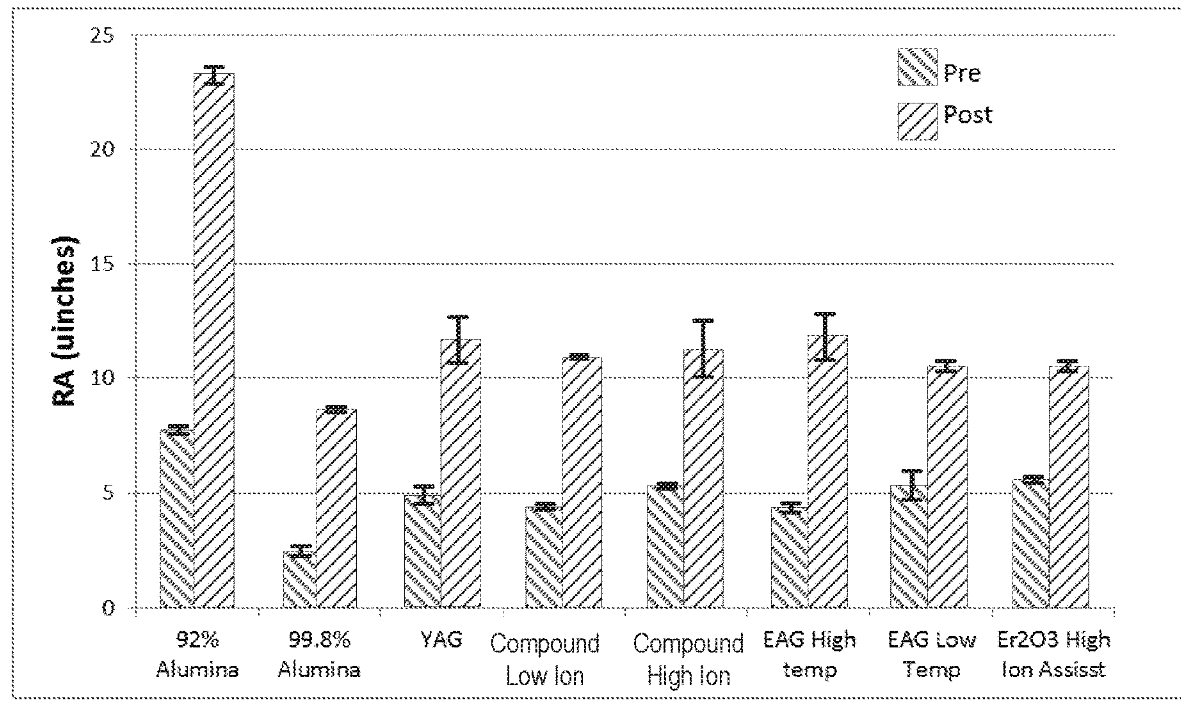

FIGS. 10-11 illustrate roughness profiles for thin film protective layers formed in accordance with embodiments of the present invention. FIG. 10 shows surface roughness profiles of thin film protective layers of FIG. 8 before and after exposure to a $CH_4/Cl_2$ plasma chemistry for 100 RFHrs. As shown, the IAD deposited thin film protective layers show a minimum change in surface roughness after exposure to a $CH_4/Cl_2$ plasma chemistry for 100 RFHrs.

FIG. 11 shows surface roughness profiles of thin film protective layers of FIG. 9 before and after exposure to an $H_2/NF_3$ plasma chemistry for 35 RFHrs. As shown, the IAD deposited thin film protective layers show a minimum change in surface roughness after exposure to an $H_2/NF_3$ plasma chemistry for 35 RFHrs.

Figure 12:
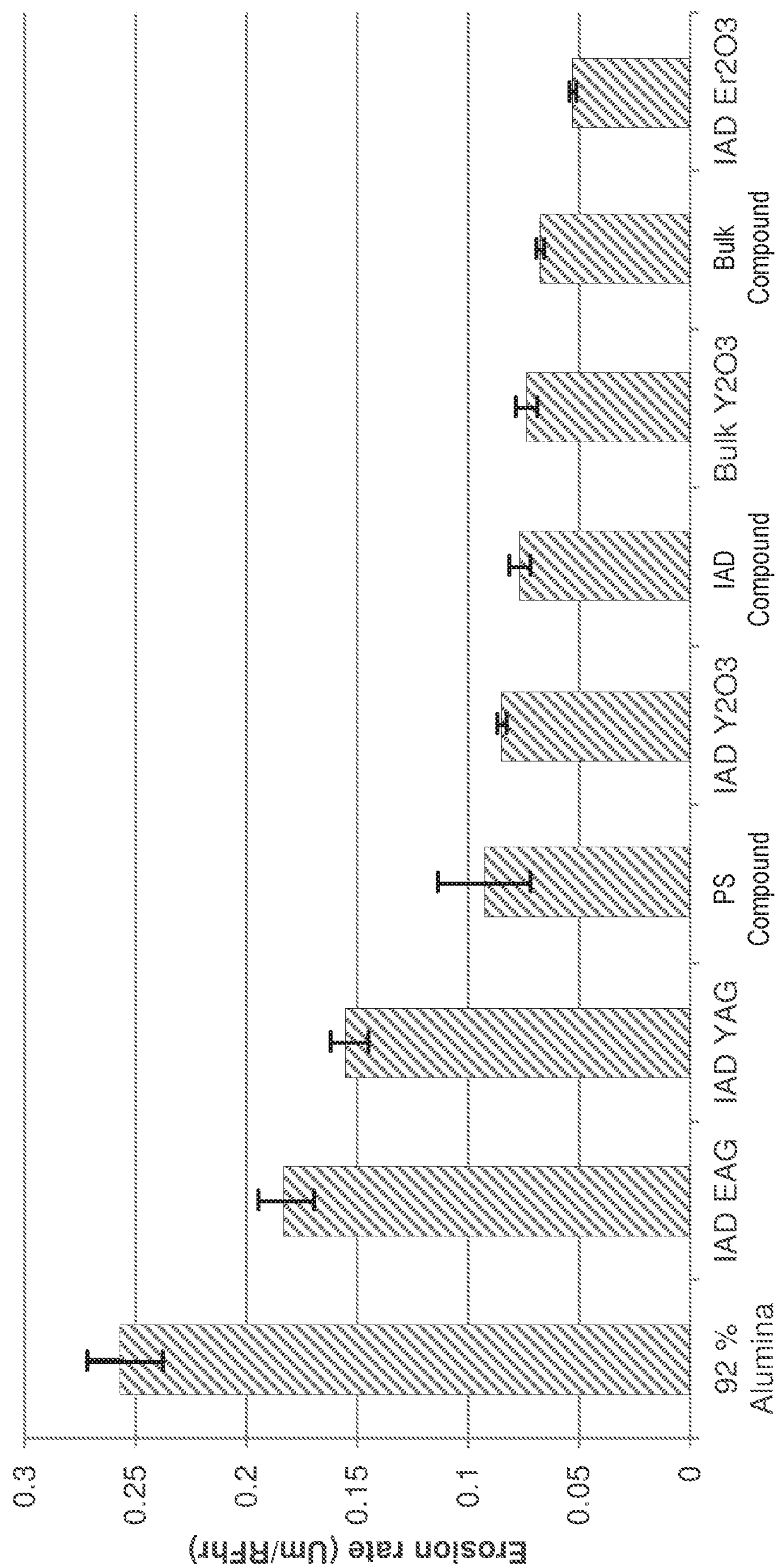
FIG. 12 shows erosion rates of various materials exposed to a $CF_4$—$CHF_3$ trench chemistry at low bias.

FIG. 12 shows erosion rates of various materials exposed to a $CF_4$—$CHF_3$ trench chemistry at low bias, including erosion rates of multiple different IAD coatings generated in accordance with embodiments described herein. As shown, an erosion rate of 92% Alumina is around 0.26 microns per radiofrequency hour (μm/Rfhr), an erosion rate of IAD deposited EAG is around 0.18 μm/Rfhr, an erosion rate of IAD deposited YAG is about 0.15 μm/Rfhr, an erosion rate of the plasma spray deposited compound ceramic is about 0.09 μm/Rfhr, an erosion rate of IAD deposited $Y_2O_3$ is about 0.08 μm/Rfhr, an erosion rate of IAD deposited ceramic compound is about 0.07 μm/Rfhr, an erosion rate of bulk $Y_2O_3$ is about 0.07 μm/Rfhr, an erosion rate of a bulk ceramic compound is about 0.065 μm/Rfhr, and an erosion rate of IAD deposited $Er_2O_3$ is about 0.05 μm/Rfhr. Similar etch results occur when these materials are etched using a $CF_4$—$CHF_3$ trench chemistry at a high bias. For example, at a high bias an etch rate of 92% Alumina is around 1.38 μm/Rfhr, an erosion rate of IAD deposited EAG is around 0.27 μm/Rfhr, an erosion rate of IAD deposited YAG is about 0.27 μm/Rfhr, an erosion rate of the plasma spray deposited compound ceramic is about 0.35 μm/Rfhr, an erosion rate of IAD deposited $Y_2O_3$ is about 0.18 μm/Rfhr, an erosion rate of IAD deposited ceramic compound is about 0.19 μm/Rfhr, an erosion rate of bulk $Y_2O_3$ is about 0.4 μm/Rfhr, an erosion rate of a bulk ceramic compound is about 0.4 μm/Rfhr, and an erosion rate of IAD deposited $Er_2O_3$ is about 0.18 μm/Rfhr.

Particle analysis after a wet clean of rings coated with a thin film rare earth oxide plasma resistant layer in accordance with embodiments of the present invention has shown particle counts of 12,612 particles per square centimeter (particles/$cm^2$) for particles greater than or equal to 0.2 mm in size, as compared to a particle count of 47,400 particles/$cm^2$ for particles greater than or equal to 0.2 mm in size with conventional rings. Particle counts of 3333 particles/$cm^2$ are shown for particles greater than or equal to 0.3 mm in size, as compared to a particle count of 12,720 particles/$cm^2$ for conventional rings. Particle counts of 702 particles/$cm^2$ are shown for particles greater than or equal to 0.5 mm in size, as compared to a particle count of 3708 particles/$cm^2$ for conventional rings. Particle counts of 108 particles/$cm^2$ are shown for particles greater than or equal to 1.0 mm in size, as compared to a particle count of 1070 particles/$cm^2$ for conventional rings. Particle counts of 20 particles/$cm^2$ are shown for particles greater than or equal to 2.0 mm in size, as compared to a particle count of 320 particles/$cm^2$ for conventional rings. Accordingly, embodiments herein produce rings with particle counts that are approximately 3.75 times lower than particle counts for traditional rings. Additionally, the level or trace metal contamination for rings produced in accordance with embodiments herein is below or equal to trace metal contamination for conventional rings.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±30%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A chamber component for a processing chamber comprising:

a ring shaped body defined by an inner diameter and an outer diameter, the ring shaped body comprising at least one of an oxide based ceramic, a nitride based ceramic or a carbide based ceramic, wherein the ring shaped body is a sintered ceramic body comprising a top flat region, a ring inner side along the inner diameter of the ring shaped body and a ring outer side along the outer diameter of the ring shaped body, wherein the ring inner side comprises an approximately vertical wall and a step on a plasma-facing surface of the ring shaped body; and a protective layer on at least the top flat region, the ring inner side and the ring outer side of the ring shaped body, wherein the protective layer is a conformal layer comprising a plasma resistant rare earth oxide, has a porosity of less than 1%, has an average surface roughness of less than 6 micro-inches, and has a first thickness of less than 300 μm on the top flat region and a second thickness on the approximately vertical wall of the ring inner side, wherein the second thickness is 45-70% of the first thickness, and wherein the protective layer comprises a composition of 40-45 mol % of $Y_2O_3$, 5-10 mol % of $ZrO_2$, 35-40 mol % of $Er_2O_3$, 5-10 mol % of $Gd_2O_3$, and 5-15 mol % of $SiO_2$.

2. The chamber component of claim 1, wherein the protective layer has a thickness of 5-15 μm.

3. The chamber component of claim 1, wherein a porosity of the protective layer is below 0.1%.

4. The chamber component of claim 1, wherein the protective layer comprises a protective layer stack comprising a first plasma resistant rare earth oxide film on the ring shaped body and a second plasma resistant rare earth oxide film on the first plasma resistant rare earth oxide film.

5. The chamber component of claim 4, wherein the first plasma resistant rare earth oxide film comprises a coloring agent that causes the first plasma resistant rare earth oxide film to have a different color than the second plasma resistant rare earth oxide film.

6. The chamber component of claim 5, wherein the coloring agent comprises at least one of $Nd_2O_3$, $Sm_2O_3$ or $Er_2O_3$.

7. The chamber component of claim 5, wherein the first plasma resistant rare earth oxide film is an amorphous layer comprising $Y_3Al_5O_{12}$ or $Er_3Al_5O_{12}$ and the second plasma resistant rare earth oxide film is a crystalline or polycrystalline layer comprising $Er_2O_3$ or a ceramic compound comprising $Y_4Al_2O_9$ and a solid-solution of $Y_2O_3$—$ZrO_2$.

8. The chamber component of claim 1, wherein the chamber component is usable at a temperature of 300° C. without causing cracking of the protective layer.

9. The chamber component of claim 1, further comprising: a transition layer between the ring shaped body and the protective layer, wherein the transition layer is a non-porous layer formed from interdiffusion of material from the ring shaped body and the protective layer.

10. The chamber component of claim 1, wherein the ring outer side is rounded.

11. A chamber component, comprising:

a ring shaped body defined by an inner diameter and an outer diameter, the ring shaped body comprising at least one of an oxide based ceramic, a nitride based ceramic or a carbide based ceramic, wherein the ring shaped body is a sintered ceramic body comprising a top flat region, a ring inner side along the inner diameter of the ring shaped body and a ring outer side along the outer diameter of the ring shaped body, wherein the ring inner side comprises a step and an approximately vertical wall and a step on a plasma-facing surface of the ring shaped body; and a protective layer on at least the top flat region, the ring inner side and the ring outer side of the ring shaped body, wherein the protective layer is a conformal layer, has a porosity of less than 1%, has an average surface roughness of less than 6 micro-inches, comprises at least one plasma resistant rare earth oxide film, and has a first thickness of less than 300 μm on the top flat region and the step of the ring inner side and a second thickness on the approximately vertical wall of the ring inner side, wherein the second thickness is 45-70% of the first thickness, and wherein the protective layer comprises a composition of 40-45 mol % of $Y_2O_3$, 5-10 mol % of $ZrO_2$, 35-40 mol % of $Er_2O_3$, 5-10 mol % of $Gd_2O_3$, and 5-15 mol % of $SiO_2$.

* * * * *